United States Patent
Aspuru-Guzik et al.

(10) Patent No.: US 11,689,223 B2
(45) Date of Patent: Jun. 27, 2023

(54) DEVICE-TAILORED MODEL-FREE ERROR CORRECTION IN QUANTUM PROCESSORS

(71) Applicant: President and Fellows of Harvard College, Cambridge, MA (US)

(72) Inventors: Alan Aspuru-Guzik, Cambridge, MA (US); Jonathan P. Olson, Cambridge, MA (US); Jhonathan Romero Fontalvo, Cambridge, MA (US); Peter D. Johnson, Cambridge, MA (US); Yudong Cao, Cambridge, MA (US); Pierre-Luc Dallaire-Demers, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 374 days.

(21) Appl. No.: 16/647,188

(22) PCT Filed: Sep. 14, 2018

(86) PCT No.: PCT/US2018/051168
§ 371 (c)(1),
(2) Date: Mar. 13, 2020

(87) PCT Pub. No.: WO2019/055843
PCT Pub. Date: Mar. 21, 2019

(65) Prior Publication Data
US 2020/0274554 A1 Aug. 27, 2020

Related U.S. Application Data

(60) Provisional application No. 62/559,081, filed on Sep. 15, 2017, provisional application No. 62/579,485, (Continued)

(51) Int. Cl.
*H03M 13/00* (2006.01)
*H03M 13/15* (2006.01)
(Continued)

(52) U.S. Cl.
CPC ........ *H03M 13/1575* (2013.01); *G06N 10/00* (2019.01); *G06N 10/70* (2022.01); *G06N 20/00* (2019.01)

(58) Field of Classification Search
CPC .... H03M 13/1575; G06N 10/00; G06N 20/00
See application file for complete search history.

(56) References Cited

U.S. PATENT DOCUMENTS

2014/0118023 A1* 5/2014 Eastin .................. H03K 19/195
326/7

FOREIGN PATENT DOCUMENTS

WO WO-2014/066054 A2 5/2014

OTHER PUBLICATIONS

Egger et al., "Adaptive Hybrid Optimal Quantum Control for Imprecisely Characterized Systems," Phys Rev Lett, 112(24):240503 (2014).

(Continued)

*Primary Examiner* — Samir W Rizk
(74) *Attorney, Agent, or Firm* — Alexander Akheizer; Erik Huestis; Foley Hoag LLP

(57) ABSTRACT

Model-free error correction in quantum processors is provided, allowing tailoring to individual devices. In various embodiments, a quantum circuit is configured according to a plurality of configuration parameters. The quantum circuit comprises an encoding circuit and a decoding circuit. Each of a plurality of training states is input to the quantum circuit. The encoding circuit is applied to each of the plurality of training states and to a plurality of input syndrome qubits to produce encoded training states. The decoding circuit is applied to each of the encoded training states to determine a plurality of outputs. A fidelity of the quantum circuit is measured for the plurality of training states based on the plurality of outputs. The fidelity is provided to a (Continued)

computing node. The computing node determines a plurality of optimized configuration parameters. The optimized configuration parameters maximize the accuracy of the quantum circuit for the plurality of training states.

49 Claims, 19 Drawing Sheets

Related U.S. Application Data filed on Oct. 31, 2017, provisional application No. 62/581,979, filed on Nov. 6, 2017.

(51) Int. Cl.
*G06N 10/00* (2022.01)
*G06N 20/00* (2019.01)
*G06N 10/70* (2022.01)

(56) References Cited

OTHER PUBLICATIONS

Ferrie et al., "Robust and efficient in situ quantum control," Phys Rev A, 91(5):052306 (2015).
International Search Report and Written Opinion for International Application No. PCT/US2018/051168 dated Feb. 22, 2019.
Johnson et al., "QVECTOR: an algorithm for device-tailored quantum error correction," arXiv preprint, 1711:1-16 (2017).
Kelly et al., "Optimal quantum control using randomized benchmarking," Phys Rev Lett, 112(24):240504 (2014).
Romero et al., "Quantum autoencoders for efficient compression of quantum data," Quantum Science and Technology, 2(4):045001 (2017).
Terhal et al., "Quantum error correction for quantum memories," Reviews of Modern Physics, 87(2):1-47 (2015).
Wan et al., "Quantum generalization of feedforward neural networks," Quantum Information, 3(1):1-10 (2017).

* cited by examiner

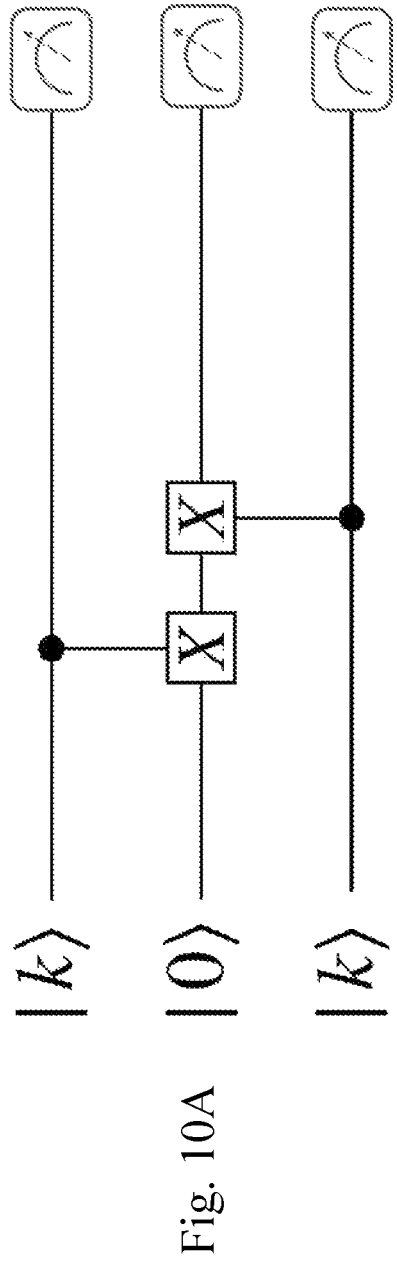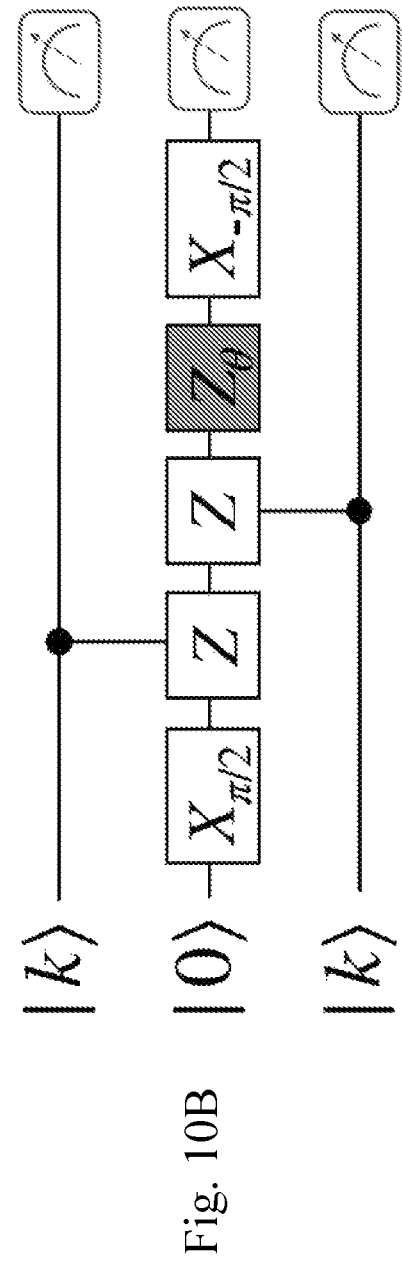

DEVICE-TAILORED MODEL-FREE ERROR CORRECTION IN QUANTUM PROCESSORS

CROSS-REFERENCE TO RELATED APPLICATIONS

This application is the U.S. National Stage of International Application No. PCT/US2018/051168, filed Sep. 14, 2018, which designates the U.S., published in English, and claims the benefit of U.S. Provisional Application No. 62/559,081, filed on Sep. 15, 1017, 62/579,485, filed Oct. 31, 2017, and 62/581,979, filed Nov. 6, 2017. The entire teachings of the above applications are incorporated herein by reference.

STATEMENT REGARDING FEDERALLY SPONSORED RESEARCH OR DEVELOPMENT

This invention was made with Government support under Grant No. FA9550-12-1-0046 awarded by the Air Force Office of Scientific Research, Grant No. N00014-16-1-2008 awarded by the Office of Naval Research and Grant No. W911NF-15-1-0256 awarded by the Army Research Office. The Government has certain rights to this invention.

BACKGROUND

Embodiments of the present disclosure relate to error correction in quantum systems, and more specifically, to device-tailored model-free error correction in quantum processors.

BRIEF SUMMARY

According to embodiments of the present disclosure, methods of and computer program products for error correction in quantum systems are provided. In various embodiments, a quantum circuit is configured according to a plurality of configuration parameters. The quantum circuit comprises an encoding circuit and a decoding circuit. Each of a plurality of training states is input to the quantum circuit. Each training state comprises a plurality of logical qubits. The encoding circuit is applied to each of the plurality of training states and to a plurality of input syndrome qubits to produce encoded training states. Each syndrome qubit has a default state. The decoding circuit is applied to each of the encoded training states to determine a plurality of outputs. A fidelity of the quantum circuit is measured for the plurality of training states based on the plurality of outputs. The fidelity is provided to a computing node. The computing node determines a plurality of optimized configuration parameters. The optimized configuration parameters maximize the accuracy of the quantum circuit for the plurality of training states.

In some embodiments, the quantum circuit further comprises a recovery circuit. In some such embodiments, the recovery circuit is applied to each of the encoded training states and to a plurality of refresh qubits. Each refresh qubit has a default state. A fidelity of the recovery circuit is measured. The fidelity of the recovery circuit is provided to the computing node. A second plurality of optimized configuration parameters is determined by the computing node. The second plurality of optimized configuration parameters maximizes the fidelity of the recovery circuit.

In some embodiments, the default state is a ground state.

In some embodiments, determining the plurality of optimized configuration parameters includes iteratively reconfiguring the quantum circuit according to a plurality of updated configuration parameters and measuring the fidelity of the quantum circuit for the plurality of training states.

In some embodiments, the plurality of training states is randomly selected from a superset of training states.

In some embodiments, measuring the fidelity comprises determining an average fidelity estimate of the quantum circuit. In some embodiments, measuring the fidelity comprises determining a worst-case fidelity of the quantum circuit. In some embodiments, measuring the fidelity comprises measuring an error rate of the quantum circuit.

In some embodiments, the quantum circuit comprises nonlinear optical media. In some embodiments, the quantum circuit comprises a cavity quantum electrodynamics device. In some embodiments, the quantum circuit comprises an ion trap. In some embodiments, the quantum circuit comprises a nuclear magnetic resonance device. In some embodiments, the quantum circuit comprises a superconducting device. In some embodiments, the quantum circuit comprises a solid state device.

According to embodiments of the present disclosure, systems for error correction in quantum systems are provided. In various embodiments, a system includes a quantum circuit. The quantum circuit includes an encoding circuit and a decoding circuit. The quantum circuit is configured to apply the encoding circuit to each of a plurality of training states and to a plurality of input syndrome qubits to produce encoded training states; apply the decoding circuit to the encoded training states to determine a plurality of outputs; measure a fidelity of the quantum circuit for the plurality of training states based on the plurality of outputs; and provide the fidelity to a computing node. Each training state comprises a plurality of logical qubits. Each syndrome qubit has a default state. The computing node comprises a computer readable storage medium having program instructions embodied therewith. The program instructions are executable by a processor of the computing node to cause the processor to perform a method. The method comprises configuring the quantum circuit according to a plurality of configuration parameters; inputting each of a plurality of training states to the quantum circuit; receiving the fidelity from the quantum circuit; and determining a first plurality of optimized configuration parameters. The optimized configuration parameters maximize the accuracy of the encoding circuit for the plurality of training states.

In some embodiments, the quantum circuit further comprises a recovery circuit. In some such embodiments, the recovery circuit is applied to each of the encoded training states and to a plurality of refresh qubits. Each refresh qubit has a default state. A fidelity of the recovery circuit is measured. The fidelity of the recovery circuit is provided to the computing node. A second plurality of optimized configuration parameters is determined by the computing node. The second plurality of optimized configuration parameters maximizes the fidelity of the recovery circuit.

In some embodiments, the default state is a ground state.

In some embodiments, determining the plurality of optimized configuration parameters further comprises iteratively reconfiguring the quantum circuit according to a plurality of updated configuration parameters and measuring the fidelity of the quantum circuit for the plurality of training states.

In some embodiments, the computing node randomly selects the plurality of training states from a superset of training states.

In some embodiments, measuring the fidelity comprises determining an average fidelity estimate of the quantum circuit. In some embodiments, measuring the fidelity comprises determining a worst-case fidelity of the quantum circuit. In some embodiments, measuring the fidelity comprises measuring an error rate of the quantum circuit.

In some embodiments, the quantum circuit comprises nonlinear optical media. In some embodiments, the quantum circuit comprises a cavity quantum electrodynamics device. In some embodiments, the quantum circuit comprises an ion trap. In some embodiments, the quantum circuit comprises a nuclear magnetic resonance device. In some embodiments, the quantum circuit comprises a superconducting device. In some embodiments, the quantum circuit comprises a solid state device.

According to embodiments of the present disclosure, methods of and computer program products for error correction in quantum systems are provided. In various embodiments, a quantum circuit is configured according to a plurality of configuration parameters. The quantum circuit comprises an encoding circuit and a decoding circuit. Each of a plurality of training states is input to the quantum circuit. Each training state comprises a plurality of logical qubits. A fidelity of the quantum circuit for the plurality of training states is received from the quantum circuit. The fidelity is determined by the quantum circuit by applying the encoding circuit to each of the plurality of training states and to a plurality of input syndrome qubits to produce encoded training states and applying the decoding circuit to the encoded training states to determine a plurality of outputs. Each syndrome qubit has a ground state. A first plurality of optimized configuration parameters is determined. The first plurality of optimized configuration parameters maximizes the accuracy of the quantum circuit for the plurality of training states.

In some embodiments, the quantum circuit further comprises a recovery circuit. In some such embodiments, a fidelity of the recovery circuit is received. The fidelity of the recovery circuit is determined by applying the recovery circuit to each of the encoded training states and to a plurality of refresh qubits. Each refresh qubit has a default state. A second plurality of optimized configuration parameters is determined. The second plurality of optimized configuration parameters maximizes the fidelity of the recovery circuit.

In some embodiments, the default state is a ground state.

In some embodiments, determining the plurality of optimized configuration parameters further comprises iteratively reconfiguring the quantum circuit according to a plurality of updated configuration parameters and measuring fidelity of the quantum circuit for the plurality of training states.

Is some embodiments, the plurality of training states is randomly selected from a superset of training states.

In some embodiments, measuring the fidelity comprises determining an average fidelity estimate of the quantum circuit. In some embodiments, measuring the fidelity comprises determining a worst-case fidelity of the quantum circuit. In some embodiments, measuring the fidelity comprises measuring an error rate of the quantum circuit.

In some embodiments, the quantum circuit comprises nonlinear optical media. In some embodiments, the quantum circuit comprises a cavity quantum electrodynamics device. In some embodiments, the quantum circuit comprises an ion trap. In some embodiments, the quantum circuit comprises a nuclear magnetic resonance device. In some embodiments, the quantum circuit comprises a superconducting device. In some embodiments, the quantum circuit comprises a solid state device.

According to embodiments of the present disclosure, methods of and computer program products for configuring a quantum memory are provided. In various embodiments, a quantum circuit is selected from a plurality of quantum circuits. The plurality of quantum circuits is arranged in series. The quantum circuit is configured according to a plurality of configuration parameters. The quantum circuit comprises an encoding circuit and a decoding circuit. Each of a plurality of training states is input to the quantum circuit. Each training state comprises a plurality of logical qubits. The encoding circuit is applied to each of the plurality of training states and to a plurality of input syndrome qubits to produce encoded training states. Each syndrome qubit has a default state. The decoding circuit is applied to the encoded training states to determine a plurality of outputs. A fidelity of the quantum circuit is measured for the plurality of training states based on the plurality of outputs. The fidelity is provided to a computing node. The computing node determines a first plurality of optimized configuration parameters. The first plurality of optimized configuration parameters maximizes the accuracy of the quantum circuit for the plurality of training states.

In some embodiments, the quantum circuit further comprises a recovery circuit. In some such embodiments, the recovery circuit is applied to each of the encoded training states and to a plurality of refresh qubits. Each refresh qubit having a default state. A fidelity of the recovery circuit is measured. The fidelity of the recovery circuit is provided to the computing node. A second plurality of optimized configuration parameters is determined by the computing node. The second plurality of optimized configuration parameters maximizes the fidelity of the recovery circuit.

In some embodiments, the default state is a ground state.

In some embodiments, determining the plurality of optimized configuration parameters further comprises iteratively reconfiguring the quantum circuit according to a plurality of updated configuration parameters and measuring accuracy of the quantum circuit for the plurality of training states.

In some embodiments, the plurality of training states is randomly selected from a superset of training states.

In some embodiments, measuring the fidelity comprises determining an average fidelity estimate of the quantum circuit. In some embodiments, measuring the fidelity comprises determining a worst-case fidelity of the quantum circuit. In some embodiments, measuring the fidelity comprises measuring an error rate of the quantum circuit.

In some embodiments, the quantum circuit comprises nonlinear optical media. In some embodiments, the quantum circuit comprises a cavity quantum electrodynamics device. In some embodiments, the quantum circuit comprises an ion trap. In some embodiments, the quantum circuit comprises a nuclear magnetic resonance device. In some embodiments, the quantum circuit comprises a superconducting device. In some embodiments, the quantum circuit comprises a solid state device.

According to embodiments of the present disclosure, a quantum memory is provided. In various embodiments, the quantum memory comprises a plurality of quantum circuits arranged in series. Each quantum circuit comprises an encoding circuit and a decoding circuit. Each quantum circuit is configured to apply the encoding circuit to each of a plurality of training states and to a plurality of input syndrome qubits to produce encoded training states; apply the decoding circuit to the encoded training states to determine a plurality of outputs; measure a fidelity of the quantum circuit for the plurality of training states based on the plurality of outputs; and providing the fidelity to a computing node. Each training state comprises a plurality of logical qubits. Each syndrome qubit has a default state. The computing node comprises a computer readable storage medium having program instructions embodied therewith. The program instructions executable by a processor of the computing node to cause the processor to perform a method. The method includes configuring each quantum circuit according to a plurality of configuration parameters; inputting each of a plurality of training states to each quantum circuit; receiving the fidelity from each quantum circuit; and determining a first plurality of optimized configuration parameters. The first plurality of optimized configuration parameters maximizes the fidelity of each quantum circuit for the plurality of training states.

In some embodiments, the quantum circuit further comprises a recovery circuit. In some such embodiments, the quantum circuit is further configured to apply the recovery circuit to each of the encoded training states and to a plurality of refresh qubits; measure a fidelity of the recovery circuit; and provide the fidelity of the recovery circuit to the computing node. Each refresh qubit has a default state. The computing node determines a second plurality of optimized configuration parameters. The second plurality of optimized configuration parameters maximizes the fidelity of the recovery circuit.

In some embodiments, the default state is a ground state.

In some embodiments, determining the plurality of optimized configuration parameters further comprises iteratively reconfiguring the quantum circuit according to a plurality of updated configuration parameters and measuring accuracy of the quantum circuit for the plurality of training states.

In some embodiments, the plurality of training states is randomly selected from a superset of training states.

In some embodiments, measuring the fidelity comprises determining an average fidelity estimate of the quantum circuit. In some embodiments, measuring the fidelity comprises determining a worst-case fidelity of the quantum circuit. In some embodiments, measuring the fidelity comprises measuring an error rate of the quantum circuit.

In some embodiments, the quantum circuit comprises nonlinear optical media. In some embodiments, the quantum circuit comprises a cavity quantum electrodynamics device. In some embodiments, the quantum circuit comprises an ion trap. In some embodiments, the quantum circuit comprises a nuclear magnetic resonance device. In some embodiments, the quantum circuit comprises a superconducting device. In some embodiments, the quantum circuit comprises a solid state device.

According to embodiments of the present disclosure, methods for error correction in a quantum circuit is provided. A quantum circuit is configured according to a plurality of configuration parameters. The quantum circuit comprises an encoding circuit and a decoding circuit. Each of a first plurality of training states is provided to the quantum circuit. Each training state is represented by a plurality of logical qubits. The encoding circuit is applied to the logical qubits representing each of the plurality of training states and to a plurality of input syndrome qubits having a default state, to produce encoded training states. A logic circuit is applied to the encoded training states and to a plurality of refresh qubits having a default state to determine a plurality of encoded outputs. The decoding circuit is applied to each of the plurality of encoded outputs to determine a plurality of unencoded outputs. An inverse of the logic circuit is applied to the plurality of unencoded outputs to determine a plurality of circuit outputs. A fidelity of the quantum circuit is determined for the plurality of training states based on the plurality of circuit outputs. The fidelity is provided to a computing node. A plurality of optimized configuration parameters is determined by the computing node. The plurality of optimized configuration parameters maximizing the fidelity of the logic circuit for the plurality of training states.

According to embodiments of the present disclosure, methods for error correction in a quantum circuit are provided. A quantum circuit is configured according to a plurality of configuration parameters. The quantum circuit comprises an encoding circuit, a sensing circuit, and a decoding circuit. A control signal is provided to the quantum circuit. The control signal is represented by a plurality of qubits. The encoding circuit is applied to the logical qubits representing the control signal and to a plurality of input syndrome qubits having a default state, to produce an encoded control state. The sensing circuit is exposed to a plurality of training conditions to determine a plurality of noisy sensor signals. The decoding circuit is applied to the plurality of noisy sensor signals to determine a plurality of outputs. A fidelity of the quantum circuit is measured for the plurality of training conditions based on the plurality of outputs. The fidelity is provided to a computing node. A plurality of optimized configuration parameters is determined by the computing node, the plurality of optimized configuration parameters maximizing the fidelity of the quantum circuit for the plurality of training conditions.

According to embodiments of the present disclosure, methods for error correction in quantum communication are provided. A quantum circuit is configured according to a plurality of configuration parameters. The quantum circuit comprises an encoding circuit. Each of a plurality of training states is provided to the quantum circuit. Each training state is represented by a plurality of logical qubits. The encoding circuit is applied to the logical qubits representing each of the plurality of training states and to a plurality of input syndrome qubits having a default state, to produce encoded training states. The encoded training states are transmitted via a communications channel to a receiver. A fidelity of the quantum circuit is determined for the plurality of training states based on the encoded training states as received by the receiver. The fidelity is provided to a computing node. A plurality of optimized configuration parameters is determined by the computing node, the plurality of optimized configuration parameters maximizing the fidelity of the encoding circuit for the plurality of training states and the communications channel.

BRIEF DESCRIPTION OF THE SEVERAL VIEWS OF THE DRAWINGS

FIGS. 10A-B are schematic views of exemplary bit-flip encoding circuits according to embodiments of the present disclosure.

DETAILED DESCRIPTION

Figure 1A:
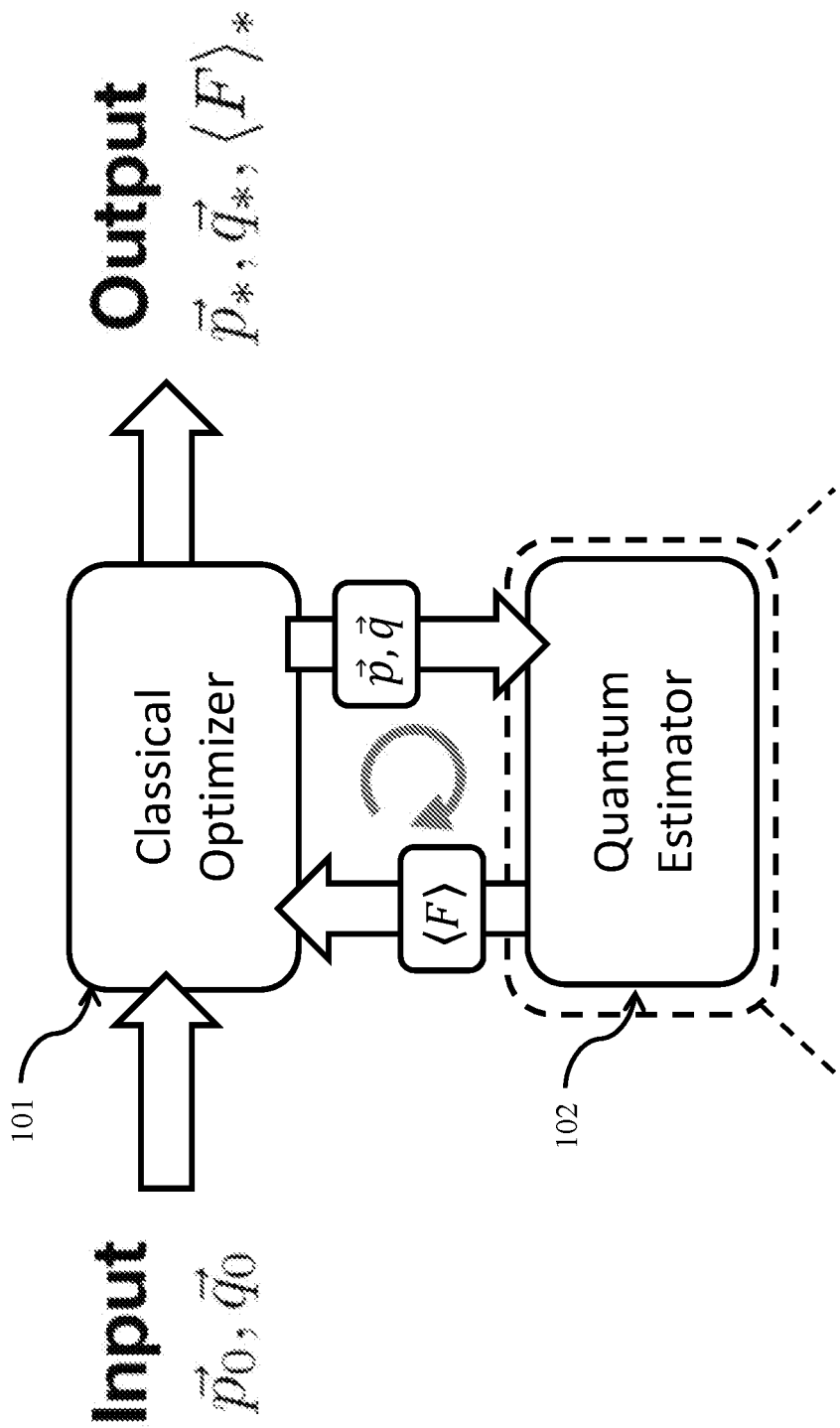
FIG. 1A is a schematic view of a hybrid quantum-classical (HQC) system for error correction according to embodiments of the present disclosure.

Uncontrollable environmental errors pose a significant impediment to quantum information processing. However, fault-tolerant threshold theorems show that, for a given degree of environmental noise, if each elementary operation can perform below a certain error rate, then concatenated quantum error correction schemes will out-pace error accumulation, enabling quantum computation to arbitrary degree of accuracy.

The objective of quantum error correction is thus to encode quantum states in some fashion such that, by virtue of such encoding, entropy build-up due to environmental noise occurs mostly on ancillary degrees of freedom. Error correction is the removal of this entropy by transforming the logical qubits, conditional upon the state of these ancillary degrees of freedom, and then resetting the state of these ancillary degrees of freedom or syndrome qubits. If too much entropy is accrued on these ancillary degrees of freedom, the noise may spill-over into the protected degrees of freedom, creating an uncorrectable logical error.

The stabilizer formalism may be used for constructing such quantum encoding. This formalism is analogous to classical linear codes that use parity checks for detecting and correcting errors. However, it is based on properties of Pauli groups which are naturally suited to treating quantum states. A variety of quantum codes may be derived using the stabilizer formalism. Examples include 1D codes, such as Shor's code and CSS code, and 2D codes, such as toric code, surface code, and color code.

More generally, operator quantum error correction may be achieved through stabilizer codes, and subsystem stabilizer codes (which permit a gauge degree of freedom in the encoding), as well as through error-avoiding techniques such as decoherence-free subspaces and noise-free subsystems.

Error correcting codes such as those described above are limited by their error model. That is, they hinge on the assumption that few-qubit errors are more likely than many-qubit correlated errors, and in some error correcting codes even assume that noise processes act independently on each individual qubits. However, such assumptions do not necessarily hold in practice. Moreover, stabilizer codes are not optimal, in general, because they are not tailored to the specific noise of a given device. In this context, for n physical qubits, k logical qubits, and a given noise model, there exists an optimal encoding-decoding pair as characterized by the maximum average fidelity or worst-case fidelity. As set out herein, the average fidelity corresponds to the cost function that is optimized in various embodiments, although various other figures of merit may be optimized as set out herein.

Other alternative approaches to fault-tolerant quantum computation, such as color code, gauge color, and surface code schemes, must devote a debilitatingly large fraction of their physical quantum bits to quantum error correction. In particular, current estimates predict that the surface code will require $10^3$ to $10^4$ physical qubits to protect a single logical qubit.

Other alternative approaches may tailor error correction to noise beyond the Pauli error model, for example by numerically optimizing encoding and decoding procedures with respect to a fixed noise model. However, such approaches are not suitable for physical quantum processing devices. In particular, as larger systems are considered, characterizations of noise are unlikely to yield noise models of sufficient accuracy. Even if the specific noise model were known, existing classical processors lack the resources to carry out optimization for quantum devices of above a few qubits, and certainly not for larger devices of, e.g., 50 to 100 qubits, or more.

To address these and other shortcomings of alternative approaches, the present disclosure provides for adaptively learning a suitable encoding without any prior assumption on the noise processes. Quantum error correction is thus provided that reduces overhead and can be implemented in existing quantum hardware and on a variety of different quantum computing architectures. Reduction in overhead is made possible by optimizing encoding and decoding circuits to drive the quantum channel capacity towards the limit defined by the actual noise in a device, as opposed to that of an artificial noise model. Parameters of a quantum circuit are variationally-optimized according to processed data originating from quantum sampling of the device.

As set out in further detail below, variation hybrid quantum-classical (HQC) algorithms are provided for generating device-tailored quantum error correcting codes for quantum memory. Variational HQC algorithms are implemented by preparing quantum states as the output of a parameterized quantum circuit. Various ansatz states are repeatedly prepared and measured to collect outcome samples. The measurement data is classically processed to update the circuit parameters so as to optimize a particular cost function. This variational optimization of a circuit constitutes a quantum analogue of many machine learning algorithms.

This approach has several advantages over alternative classical optimization schemes. First, there is no need for a noise model because the optimization is carried out in situ and so the noise perfectly simulates itself on the device. Second, the optimization step is not hindered by the exponential scaling of the Hilbert space dimension. Measurement statistics, obtained using the device as a quantum sampler, are used to approximate the average fidelity of the encoding-decoding scheme. This average fidelity serves as the cost function for the classical optimization algorithm.

As used herein, a quantum gate (or quantum logic gate) is a basic quantum circuit operating on a small number of qubits. By analogy to classical computing, quantum gates form quantum circuits, like classical logic gates form conventional digital circuits. Quantum logic gates are represented by unitary matrices. Various common quantum gates operate on spaces of one or two qubits, like classical logic gates operate on one or two bits. As matrices, quantum gates can be described by $2^n \times 2^n$ sized unitary matrices, where n is the number of qubits. The variables that the gates act upon, the quantum states, are vectors in $2^n$ complex dimensions. The base vectors indicate the possible outcomes if measured, and a quantum state is a linear combinations of these outcomes. The action of the gate on a specific quantum state is found by multiplying the vector which represents the state by the matrix representing the gate.

The general mathematical formalism of subspace code quantum error correction is summarized as follows. First, k-qubits of logical quantum information $\mathcal{H}_L \simeq \mathcal{Q}^{\otimes k}$ are encoded via an encoding process $\varepsilon$ into n physical qubits $\mathcal{H}_P \simeq \mathcal{Q}^{\otimes n}$. Next, the physical qubits are subjected to some noise process $\mathcal{N}$. Finally, the quantum information is attempted to be recovered by a decoding process $\mathcal{D}$. The quality of the quantum error correction scheme can be characterized by how well the sequence of processes approximates the identity channel $\mathcal{N} \circ \varepsilon \approx 1$, which may be quantified by either the average fidelity or worst-case fidelity of the quantum process, or by some other figure of merit. It will be appreciated that any given figure of merit may be adopted in various embodiments and thereby optimized as set out herein.

An encoding may be employed in which encoded states are pure: $\varepsilon(|\psi\rangle\langle\psi|) = |\bar{\psi}\rangle\langle\bar{\psi}|$. With respect to the physical qubits, $|\bar{\psi}\rangle$ will generally be a highly entangled state (not well-approximated by a separable state). The linear span of state vectors in the range of $\varepsilon$ is referred to as the code space $\mathcal{C}$. The code space is a $2^k$-dimensional subspace of the physical Hilbert space, $\mathcal{C} \leq \mathcal{H}_P$. It is instructive to factor the code space into a logical subsystem $\mathcal{H}_L$ and a syndrome subsystem $\mathcal{H}_S$ as in Equation 1, where $|s_0\rangle$ is a fixed state of $\mathcal{H}_S$.

$$C = \mathcal{H}_L \otimes \text{span}(|s_0\rangle) \leq \mathcal{H}_P = \mathcal{H}_L \otimes \mathcal{H}_S \qquad \text{Equation 1}$$

This factorization does not correspond to a separation of physical qubits, but rather to a separation of virtual subsystems.

The encoding should be chosen to match the features of the noise model. The noise may be modeled as a completely positive trace-preserving map, expressed in Kraus representation as $\mathcal{N}(\bullet) = \Sigma_j K_j \cdot K_j^\dagger$. Perfect recovery is possible if and only if there exists encoding code $\mathcal{C}$ and unitary $V^\dagger$ such that each Kraus operator satisfies Equation 2 for all $|\bar{\psi}\rangle \in \mathcal{C}$ and for some $|\phi_j\rangle$ which depend on $K_j$.

$$K_j |\bar{\psi}\rangle = V^\dagger(|\bar{\psi}\rangle \otimes |\tau_j\rangle) \qquad \text{Equation 2}$$

This is a rephrasing of the Knill-Laflamme condition for exact correctability. Conditional upon the syndrome system $\mathcal{H}_S$ being initialized in $|s_0\rangle$, the logical quantum information is protected from the noise in the virtual subsystem $\mathcal{H}_L$. If errors are to be corrected while the quantum information is still encoded, $V^\dagger$ in inverted by the application of V and the syndrome system is reset back to $|s_0\rangle$. At the decoding step, the logical subsystem is mapped back into the k-qubit system $\mathcal{H}_L$, and the syndrome qubits are traced out.

Figure 1B:
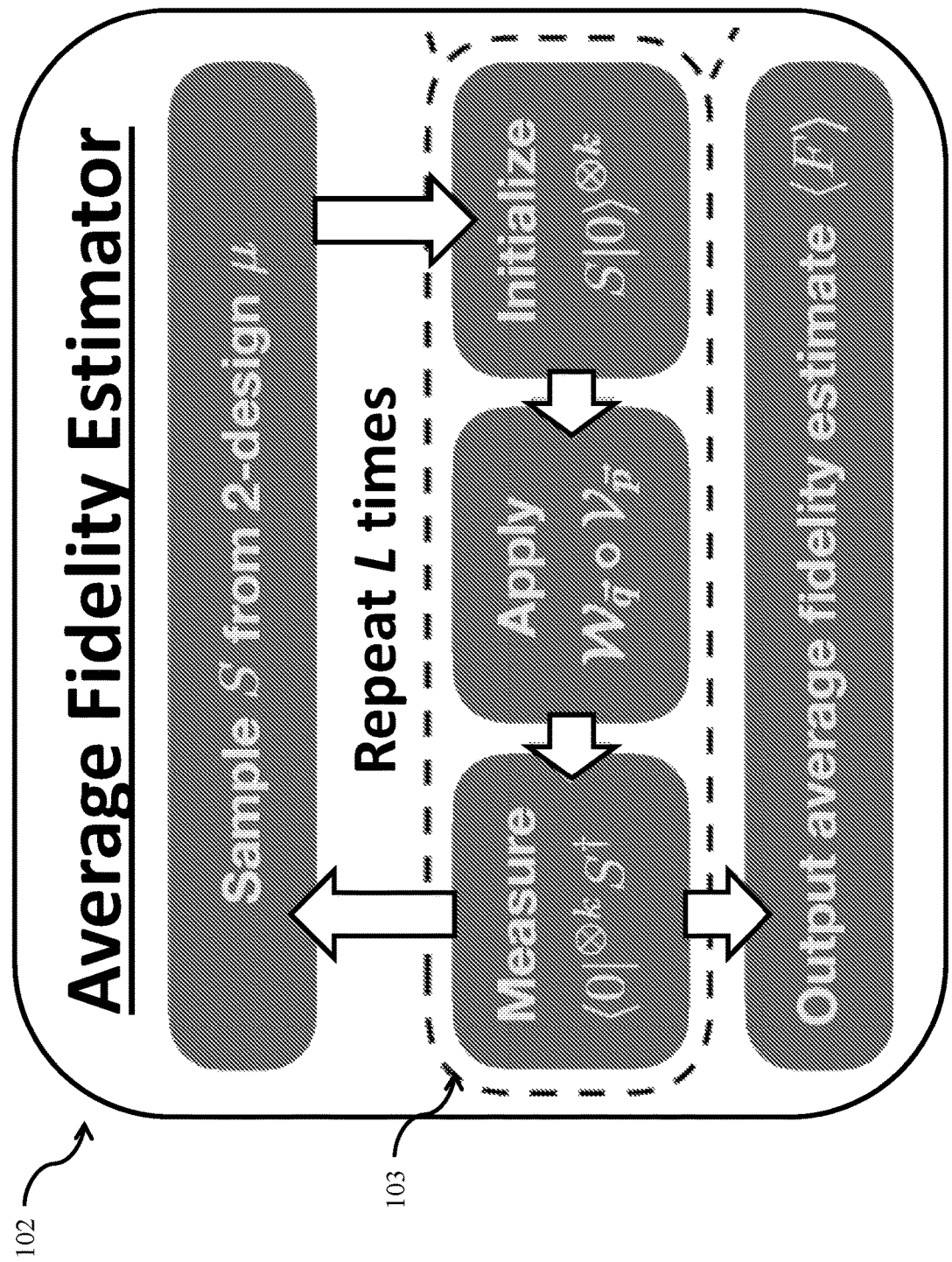
FIG. 1B is a schematic view of a fidelity estimator of a system for error correction according to embodiments of the present disclosure.
Figure 1C:
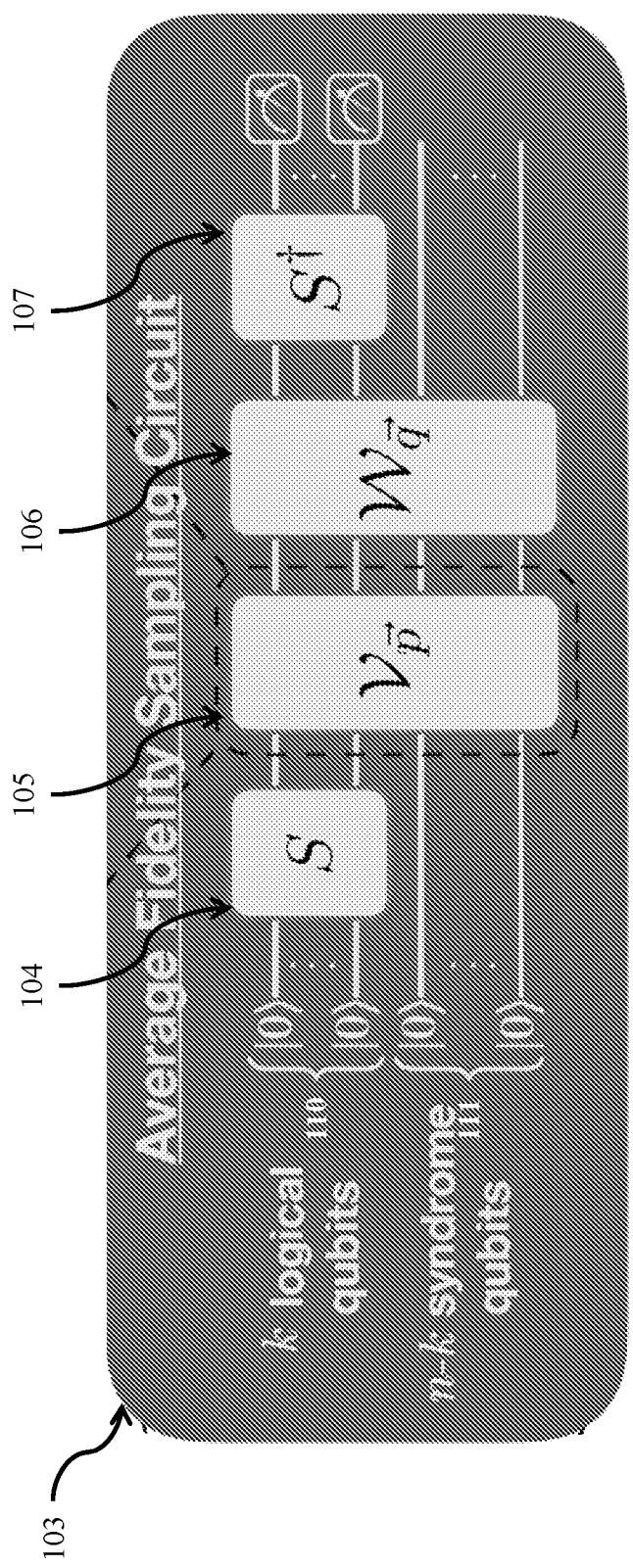
FIG. 1C is a schematic view of a fidelity sampling circuit of a system for error correction according to embodiments of the present disclosure.
Figure 1D:
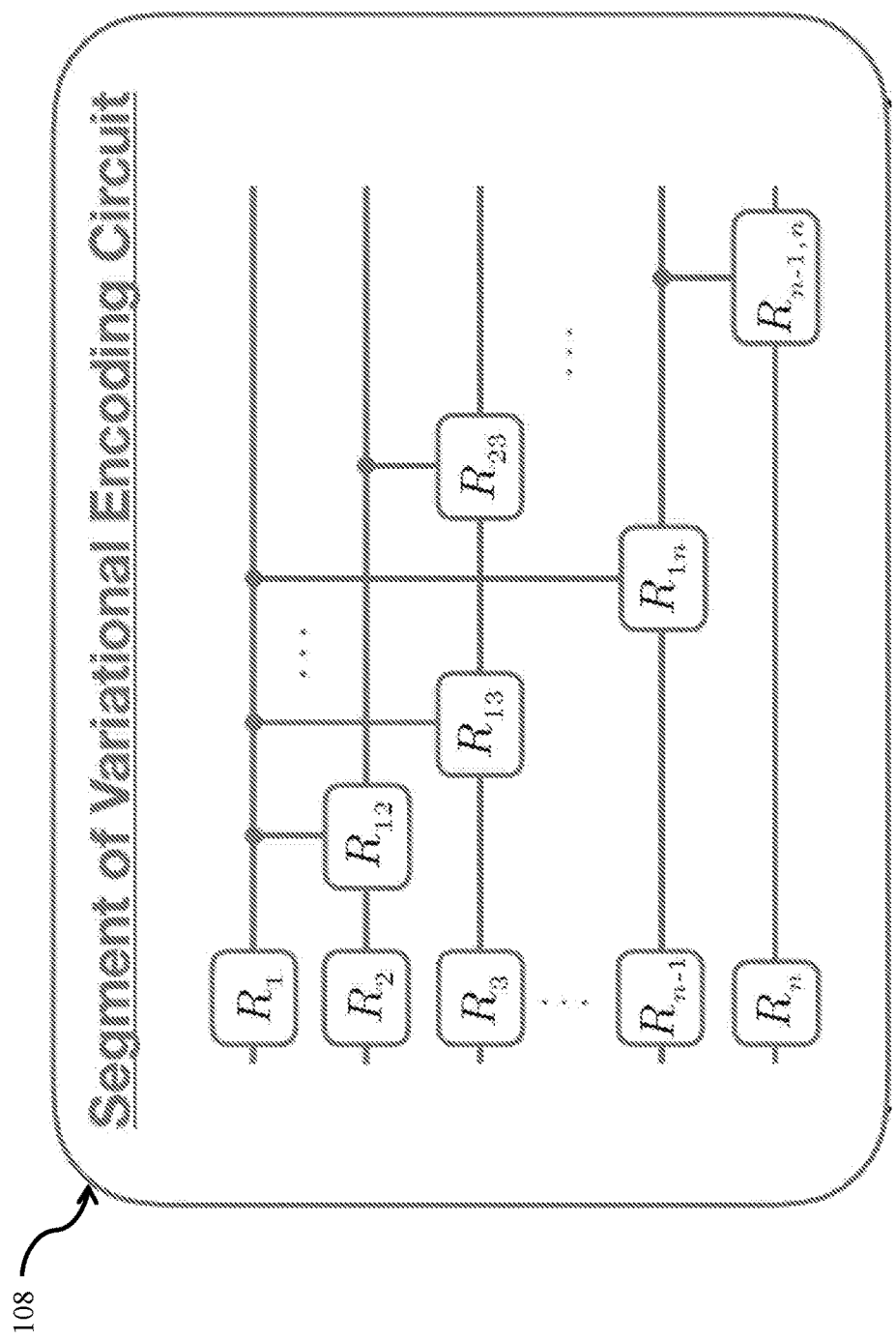
FIG. 1D is a schematic view of an exemplary segment of a variational encoding quantum circuit according to embodiments of the present disclosure.

Referring now to FIGS. 1A-D, an exemplary hybrid quantum-classical (HQC) system is illustrated. During the training stage, a classical optimizer 101 is used to optimize a function whose output value is determined by calling a quantum subroutine, the quantum average fidelity estimator 102. The quantum average fidelity estimator 102 uses a variational quantum circuit to send random-sampled states $S|0\rangle^{\otimes k}$ through the circuit 103 $W_{\vec{q}} \circ V_{\vec{p}}$ and records the measured channel fidelity of each system as 0 or 1. The average of these measured channel fidelities is output and fed back to the classical optimizer 101. Within each call to the average fidelity estimator 103, the quantum circuit is run L times. In each run, the state $|0\rangle^{\otimes n+r}$ is initialized on k logical qubits, n–k syndrome qubits, and r refresh qubits. In the example of FIGS. 1B-C, r=0. Non-zero values for r are discussed below with regard to FIGS. 2A-B. The k logical qubits are transformed by the 2-design sampled unitary 104 S, the noisy encoding-recovery circuits 105, 106 $V_{\vec{p}}$ and $W_{\vec{q}}$ are applied, the inverse 107 of S is applied, and the k logical qubits and n–k syndrome bits are measured in the computational basis. It will be appreciated that in embodiments where r=0, recovery corresponds to decoding the encoded state. The variational circuit $V_{\vec{p}}$ and $W_{\vec{q}}$ may be parameterized in a suitable device-specific manner. One example of $V_{\vec{p}}$, constructed from single-qubit rotations and 2-qubit controlled-rotations is depicted in FIG. 1D. In this example, the variational parameters $(\vec{p}, \vec{q})$ are the rotation angles of each circuit element.

Quantum variational error corrector algorithms according to the present disclosure output an encoding and decoding circuit that sufficiently corrects errors in a quantum memory. The encoding-recovery circuits are first optimized, or trained. The encoding-recovery then functions as an error correction scheme. The encoding unitary encodes any state on k qubits, whose information is to be protected from a noisy channel into a state on n qubits such that errors can be removed by applying the error recovery circuit.

Figure 2A:
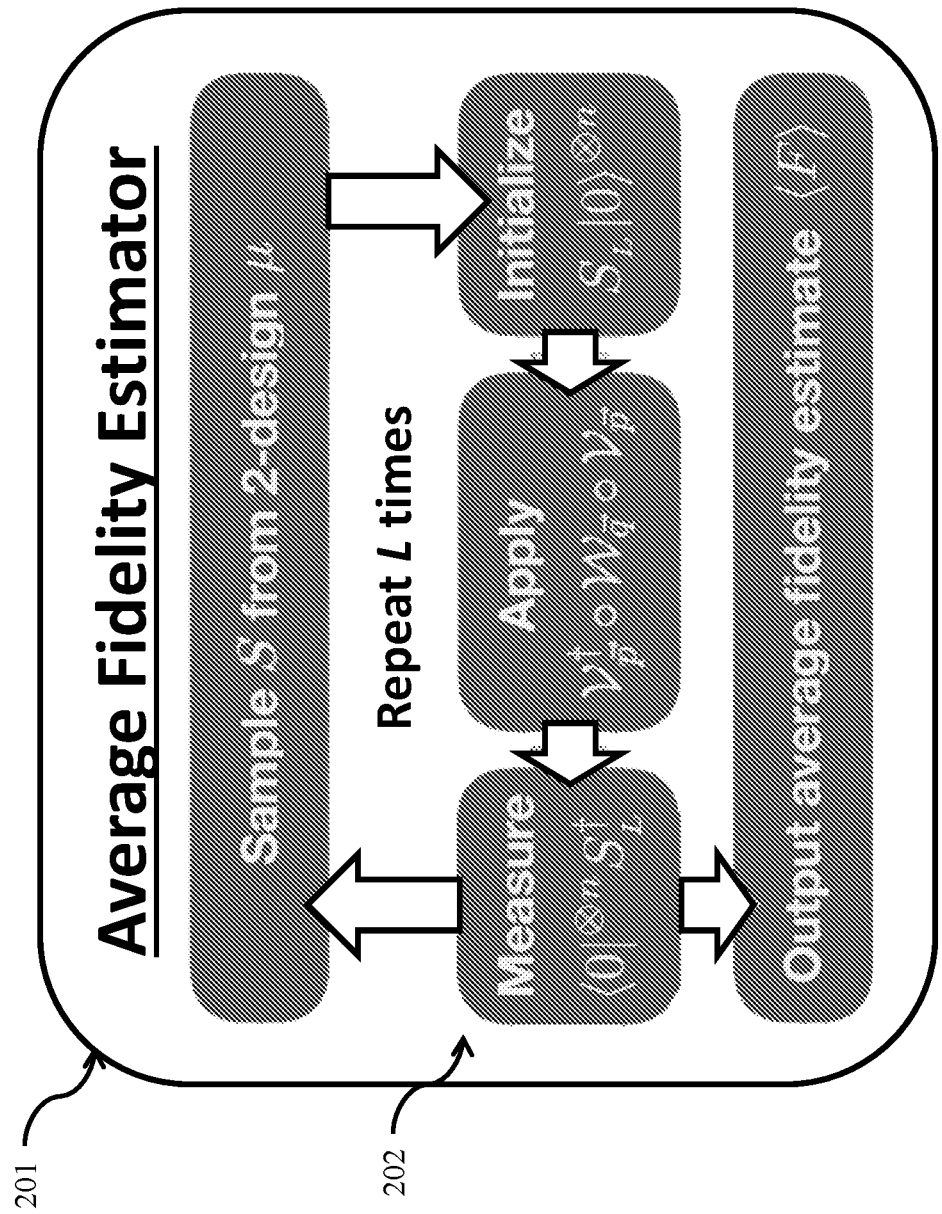
FIG. 2A is a schematic view of a second fidelity estimator of a system for error correction according to embodiments of the present disclosure.
Figure 2B:
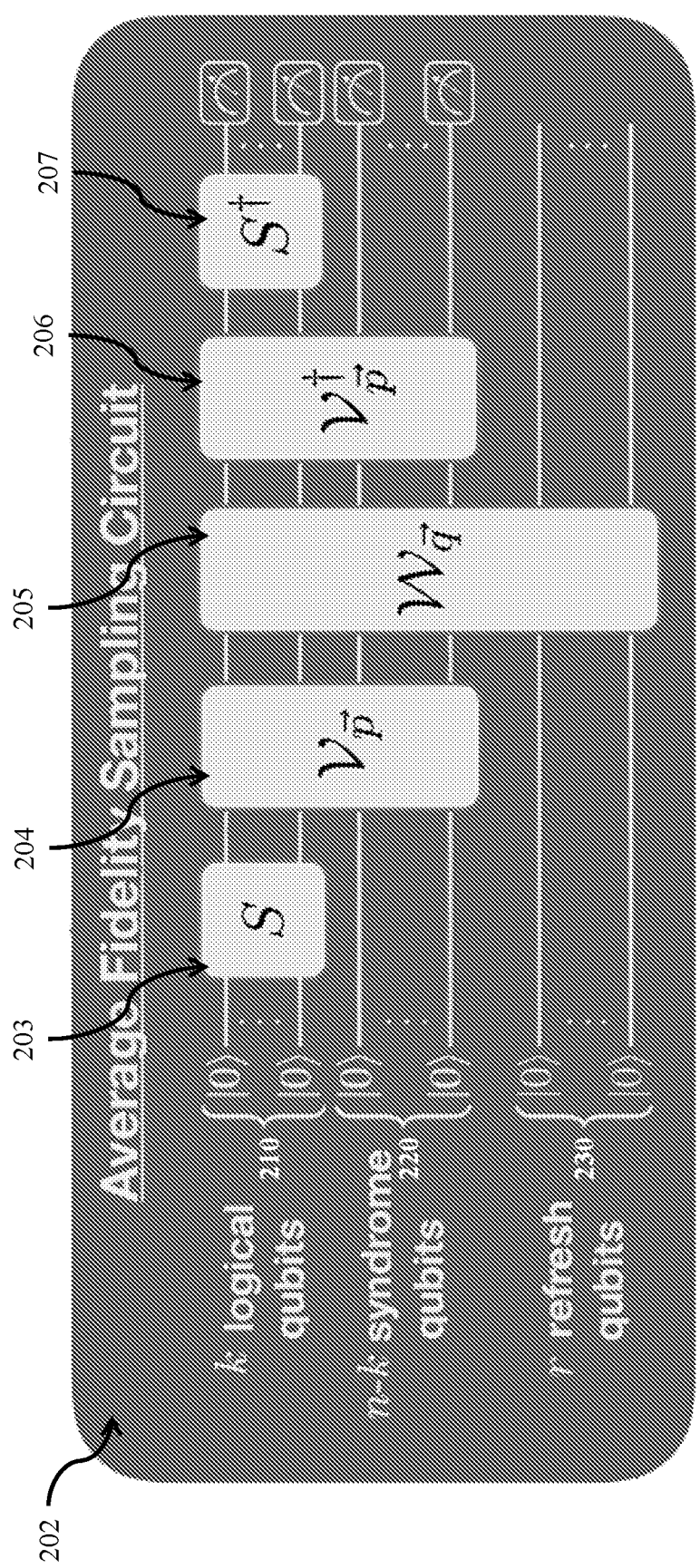
FIG. 2B is a schematic view of a second fidelity sampling circuit of a system for error correction according to embodiments of the present disclosure.

The encoding and recovery are each parameterized circuits $V_{\vec{p}}$ and $W_{\vec{q}}$, as depicted in FIG. 1C (and in FIG. 2B for r>0). Accordingly, they are referred to herein as an encoding circuit and as a recovery circuit. Likewise, the decoding is a parametrized circuit ($V_{\vec{p}}^\dagger$ in FIG. 2B) and is referred to herein as a decoding circuit. In various embodiments, the figure of merit for each encoding-recovery pair is chosen as the quantum channel Haar average fidelity, which is equal to the input-output fidelity Haar-averaged over all pure states. Qualitatively, the (Haar) average fidelity captures how well an arbitrary state is expected to be preserved by the channel. Quantitatively, the average fidelity of a quantum channel $\mathcal{M}: \mathcal{B}(\mathcal{H}) \to \mathcal{B}(\mathcal{H})$ is defined by Equation 3, where the integral is performed with respect to the Haar measure on the space of unitary matrices acting on the d-dimensional Hilbert space $\mathcal{H}$.

$$\langle F \rangle = \int_{u(d)} \langle 0|S^\dagger \mathcal{M}(S|0\rangle\langle 0|S^\dagger) S|0\rangle \, dS \qquad \text{Equation 3}$$

In various other embodiments, alternative figures of merit are adopted. For example, the worst-case fidelity, or simply the error rate, may be used as a metric for the quality of a quantum process. Alternatively, the cost function may correspond to the energy of the quantum state, obtained from measuring a Hamiltonian.

As a hybrid quantum-classical algorithm, a quantum and a classical processing unit work in tandem. The objective of the classical processing unit is to optimize the average fidelity with respect to the circuit parameters ($\vec{p}, \vec{q}$), while the quantum information processing unit is called by the classical processor as a subroutine to estimate the average fidelity associated with the given encoding-recovery pair ($V(\vec{p}), W(\vec{q})$).

The average fidelity estimation is carried out using a sampling approach as follows. The input-output fidelity of each term in Equation 3 can be efficiently computed by preparing $|0\rangle^{\otimes k}|0\rangle^{\otimes n-k}$, applying $(S^{\dagger}\otimes\mathbb{I})W(\vec{q})V(\vec{p})(S\otimes\mathbb{I})$, followed by measurement of the first k qubits in the computational basis. After N trials, the fraction of all-0 outcomes estimates the fidelity with standard deviation $$O\left(\frac{1}{\sqrt{N}}\right).$$

In order to obtain an estimate of the average fidelity the above scheme would need to be repeated many times, sampling U from the Haar measure. Sampling from the Haar measure is inefficient. However, in this case, it is only necessary to sample from a measure which matches the first two moments of the Haar measure. A unitary 2-design is such a measure μ on the unitary group $\mathcal{U}(d)$, satisfying Equation 4.

$$\int_{\mathcal{U}(d)} S^{\otimes 2}\otimes S^{\dagger\otimes 2}d\mu(S)=\int_{\mathcal{U}(d)} U^{\otimes 2}\otimes U^{\dagger\otimes 2}dU \qquad \text{Equation 4}$$

With a 2-design μ, the average fidelity of the encoding-decoding is given by Equation 5, where $V_{\vec{p}}$ and $W_{\vec{q}}$ are the physically implemented, noisy versions of the parameterized circuits.

$$\langle F\rangle\equiv\int_{\mathcal{U}(d)}\langle 0|S^{\dagger}W_{\vec{q}}V_{\vec{p}}(S|0\rangle\langle 0|S^{\dagger})S|0\rangle d\mu(S) \qquad \text{Equation 5}$$

By choosing a suitable unitary 2-design, the average fidelity can be estimated with standard deviation $$O\left(\frac{1}{\sqrt{N}}\right),$$

where in each of me N trials, a unitary is sampled from the 2-design. In some embodiments, a ε-approximate 2- design, such as the Nakata circuit, which is particularly simple to implement. Using this approximate 2-design, each quantum measurement is interpreted as returning a binary sample from a biased estimator of the true average fidelity. As described further below, using $\ell$ applications of a randomization circuit, the bias of this estimator is upper bounded by $$\frac{2^{k(\ell+1)}+2^{k\ell}-2}{2^{2k\ell}(2^k-1)}\sim O(1/2^{k\ell}).$$

Thus, after N samples from this biased estimator, the estimated average fidelity is expected to deviate from the true average fidelity as $$O\left(\frac{1}{\sqrt{N}}+\frac{1}{2^{k\ell}}\right).$$

Referring back to FIG. 1A, the fidelity estimation algorithm 102 is treated as a subroutine that is called by the classical processor 101 that performs the optimization. The quantum speedup of this approach is due to the efficiency with which a quantum circuit can be used to estimate its own average fidelity.

Once the circuits are established, a set of states is selected for training. In some embodiments, the states are selected at random from a larger training set. However, the states may be manually selected according to the requirements of particular applications. It is assumed that the training set of states can be prepared by applying the unitaries S. If the encoding and decoding unitaries are able to achieve perfect error correction and assuming the error introduced is therefore negligible, the expected state in the protected register of k logical bits and n–k syndrome bits is $|0\rangle^{\otimes n}$. Any deviation from this result indicates an imperfect error-recover process. Therefore, it is possible to write a cost function in terms of single qubit measurements in the Z-basis to quantify the deviation from this ideal behavior. By using the procedure described herein to optimize the values of $\vec{p}, \vec{q}$, the optimal encoding and decoding unitaries may be determined.

Referring back to FIG. 1C, the protected register 110 corresponds to the error-corrected qubits, comprising the information that needs to be preserved. The syndrome register 111 corresponds to ancilla qubits that collect the effect of noise at the end of the protocol.

The optimization starts by choosing an initial set of parameters. This initial condition can be generated, for example, by evaluating the cost function at several random positions and choosing the parameters associated with the best value of the cost function to start with. The parameters generated by the optimization routine are input to the quantum computer using the classical-quantum software interface available in the hardware where the scheme is implemented. This interface translates a desired gate operation with a given parameter into the physical sequence of operations that implement the desired gate on the quantum hardware. The fidelity estimation obtained from the execution of the quantum algorithm can be passed using the same interface to the optimization routine. Both the classical-quantum interface and the optimization routine are executed on a classical computer.

It will be appreciated that a variety of mathematical optimization methods may be used to find optimal parameters. In general, input values are selected from among a training set, the figure of merit is computed via the quantum methods described herein to approach an optimal value. Where the selected figure of merit is a cost function, mathematical optimization is applied to minimize the cost, while a fidelity function would be maximized. Various mathematical optimization methods are known in the art, for example, derivative-free optimization methods such as Nelder-Mead, COBYLA, or Powell, as well as method that employ gradient information such as BFGS, Conjugate Gradient, Simultaneous Perturbation Stochastic Approximation (SPSA). Gradients can be obtained numerically or analytically. For example, Bayesian optimization may be employed.

Referring now to FIGS. 2A-B, a second fidelity estimator and fidelity sampling circuit are illustrated. In this exemplary embodiment, the quantum average fidelity estimator 201 uses a variational quantum circuit to send random-sampled states $S_L|0\rangle^{\otimes n}$ through the circuit 202 as described above with regard to FIG. 1. The k logical qubits are transformed by the 2-design sampled unitary 203 S, the noisy encoding-recovery circuits 204, 205 $V_{\vec{p}}$, $W_{\vec{q}}$, and $V_{\vec{p}}^\dagger$ are applied, the inverse 207 of S is applied, and the k logical qubits and n–k syndrome bits are measured in the computational basis. It will be appreciated that in this configuration, the training of the encoding and recovery processes can be conducted independently. This is desirable when using a classical optimization method that scales poorly with increased parameter number.

Training according to some such embodiments has two phases. In a first phase, the number of refresh qubits is set to zero (r=0) and the cost function is simplified to be the average fidelity of the k decoded logical qubits (measured in the computational basis of the first k qubits). In a second phase, the number of refresh qubits is increased to the desired value (r>0), the encoding circuit $V_{\vec{p}}$ obtained in the first phase is not varied, and only the encoded recovery circuit $W_{\vec{q}}$ is optimized, using the standard average fidelity as the cost function (measured in the computational basis of the first n qubits). A decrease in the number of refresh qubits affords a decrease in the complexity of the corresponding recovery circuit $W'_{\vec{q}}$, r=0. Accordingly, the first phase above should obtain a sufficient encoding $V_{\vec{p}}$ training on a cost function with decreased parameters. In the second phase, by holding $V_{\vec{p}}$ fixed, only $W_{\vec{q}}$, r>0 is optimized, entailing a cost function, with fewer parameters.

In other embodiments, the system is adapted to allow training when the preparation and measurement circuits S induce noise that renders the signal (average fidelity) small relative to the noise. In such embodiments, interleaved randomized benchmarking is employed. This method mitigates the effect of state preparation and measurement error in the estimation of average fidelity. Interleaved randomized benchmarking entails m iterations of the error correction circuit, interleaved with appropriate random unitaries (analogous to the state preparation and measurement circuits S). The average fidelity estimate is obtained for sufficiently many iteration lengths m, and then the average fidelity per iteration is determined from a fit of this data. Although more complex, this procedure enables a more accurate average fidelity estimate, and hence a more reliable optimization scheme.

In various additional embodiments, alternative fidelities may be optimized. For example, the average code fidelity may be optimized, as computed from the logical and syndrome qubits. The average subsystem code fidelity may be optimized, as computed from the logical qubits and a proper subset of the syndrome qubits.

Figure 3A:
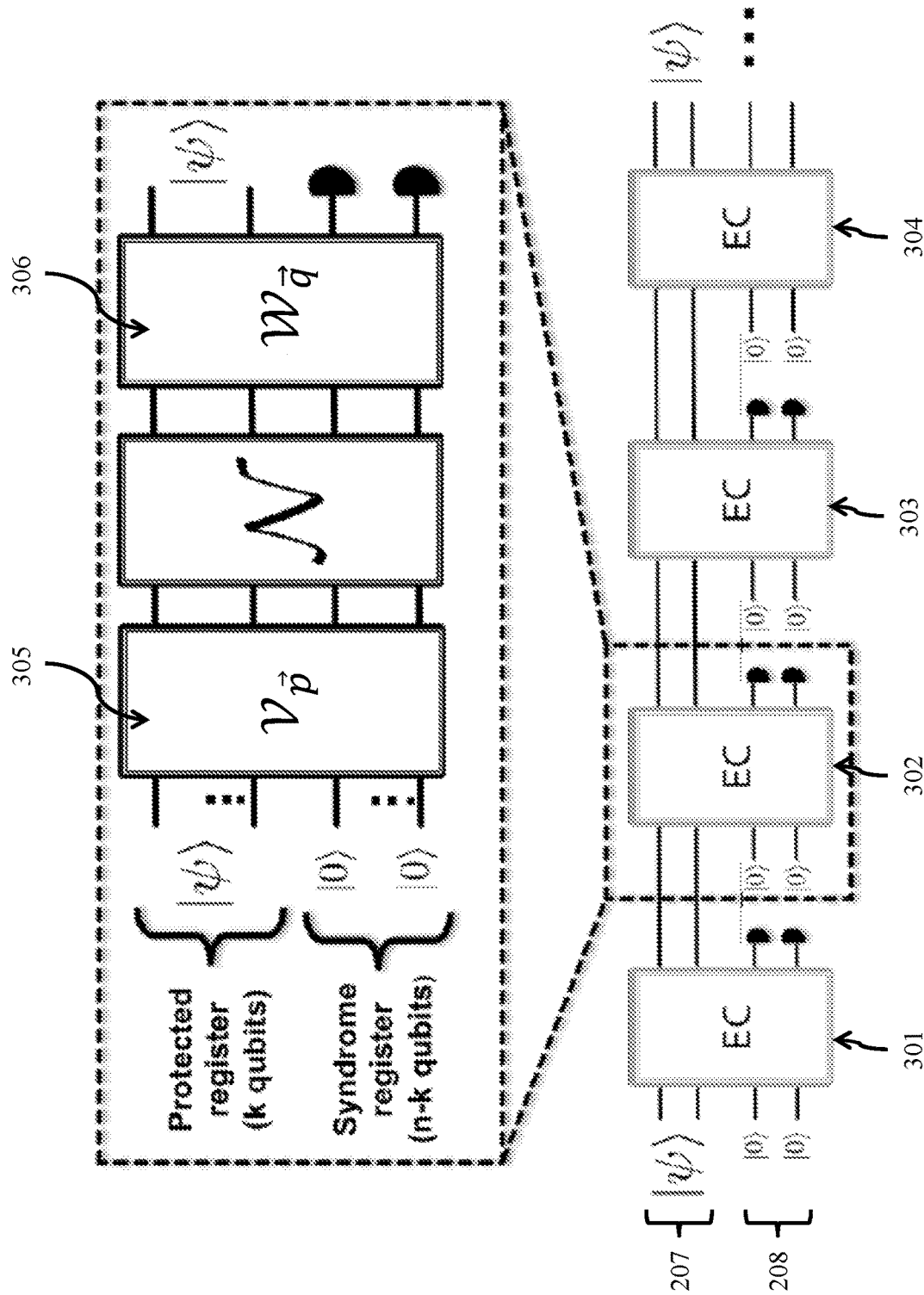
FIGS. 3A-3B are a schematic view of a composite error correction circuit according to embodiments of the present disclosure.

Referring now to FIG. 3A, a plurality of error correcting units are illustrated according to the present disclosure. Each error correction (EC) unit 301 . . . 304 includes an encoder/recovery pair 305 . . . 306. Protected register 307 corresponds to the error-corrected qubits, comprising the information that needs to be preserved. The syndrome register 308 corresponds to ancilla qubits that collects the effect of noise at the end of the protocol. After performing training as described above, the optimal unitaries may be employed to preserve a quantum state by continuously correcting errors in the protected register. This is achieved by applying several cycles of the optimal encoding and decoding unitaries, represented by the error-correction (EC) operation. Every time the EC operation is applied, the syndrome register is refreshed.

In this way, once the circuit is trained to a sufficient average fidelity, it may be used as an encoder-recovery-decoder for preserving a quantum memory. Errors on the encoded state are corrected by applying the encoded recovery circuit. This recovery circuit may be repeated indefinitely, with each segment incurring a fixed average fidelity loss. After the sequence of recoveries, the encoded quantum information may be decoded by inverse application of the encoding circuit.

It will be appreciated that the introduction of the recovery circuit mitigates errors that may occur in systems that include just an encoding-decoding cycle. In particular, at each stage when the quantum information is fully decoded, the logical qubits are as vulnerable to error as they would be without error correction. To diminish such errors, the decoding-refresh-encoding sequence may be performed on very short time scales relative to the error rate. Accordingly, the encoding-recovery-decoding cycle described above with regard to FIG. 2B is particularly adapted for quantum memory applications.

Figure 3B:
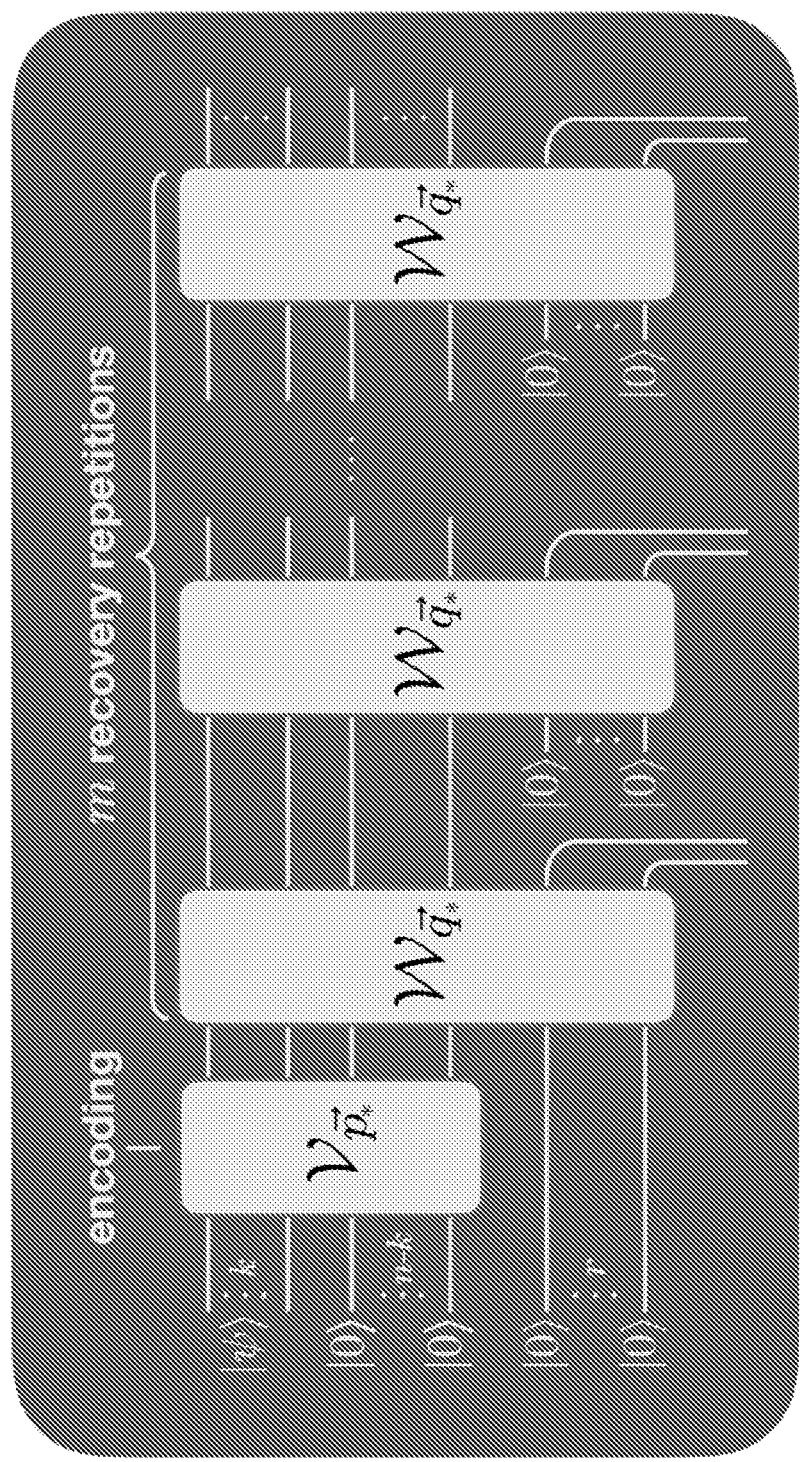

Referring to FIG. 3B, a plurality of recovery repetitions are depicted in series. In this embodiment, a single decoding circuit is coupled with a plurality of recovery repetitions, each recovery circuit receiving refresh qubits as described above with reference to FIG. 2B.

The action of an error correcting code can be characterized by considering the combined actions of both the noise and the recovery in the code space. Alternatively, an equivalent formulation is available that is equivalent to the conventional consideration but does not require any discussion on the recovery operation. Specifically, for code space $\mathcal{C}$ which is a subspace of the physical qubit Hilbert space $\mathcal{H}_p$, and noise process $\mathcal{N}$, the encoding for $\mathcal{C}$ is robust against the noise $\mathcal{N}$ if and only if there is an isomorphism $\sigma: \mathcal{H}_p \simeq (\mathcal{C} \otimes \mathcal{S}) \otimes \mathcal{H}$ such that for any operation $K_j$ in the Kraus representation of the noise $\mathcal{N}$ and any $|\overline{\psi}\rangle \in \mathcal{C}$ with corresponding state $|\omega\rangle \in \mathcal{H}_L$, we have Equation 6 for some state $|K_j\rangle$ that depends on the operator $K_j$.

$$K_j|\overline{\psi}\rangle = \sigma(|\overline{\psi}\rangle \otimes |K_j\rangle) \quad \text{Equation 6}$$

Here $\mathcal{S}$ is a space of error syndromes and $\mathcal{H}_D$ is spanned by any states that are orthogonal to the space span $\{K_j|\overline{\psi}\rangle \,|\, K_j \in \mathcal{N}, |\overline{104}\rangle \in \mathcal{C}\}$. These are the states that cannot be reached from $\mathcal{C}$ by any noise operation $K_j$. The above statement can be modified by replacing the $\overline{\psi}$ inside $\sigma(\bullet)$ with the logical state $\psi$ and replace $\sigma$ with the composed isomorphism $\xi = \sigma \circ (\varepsilon \otimes I_S \otimes I_D)$, yielding Equation 7 assuming the encoding $\varepsilon$ from $\mathcal{H}_L$ to $\mathcal{C}$ preserves the dimension of the logical state space $\mathcal{H}_L$.

$$K_j|\overline{\psi}\rangle = \xi(|\psi\rangle \otimes |K_j\rangle) \quad \text{Equation 7}$$

The bit-flip code is used as an example to illustrate the recovery-independent view summarized in Equation 6. The goal is to protect a one-qubit Hilbert space $\mathcal{H}_L = \text{span}\{|\psi_0\rangle, |\psi_1\rangle\}$ from bit-flip errors with $|\psi_0\rangle = |0\rangle$ and $|\psi_1\rangle = |1\rangle$. The encoding $\varepsilon$ gives rise to a code space $\mathcal{C} = \text{span}\{|\overline{\psi}_0\rangle, |\overline{\psi}_1\rangle\}$ with $\overline{\psi}_0 = 000$ and $\overline{\psi}_1 = 111$. The noise operator $\mathcal{N}$ is assumed to be a probabilistic mixture of four unitary operators: $K_0 = I$, $K_1 = X_1$, $K_2 = X_2$, and $K_3 = X_3$, where $X_i$ acts on the i-th qubit among the three qubits. The isomorphism $\xi$ is realized by a unitary $V_\xi$ that accomplishes the transformations of Equation 8.

$$V_\xi(|\psi_0\rangle \otimes |K_0\rangle) = V_\xi(|0\rangle \otimes |00\rangle) = |000\rangle = K_0|\overline{\psi}_0\rangle$$

$$V_\xi(|\psi_0\rangle \otimes |K_1\rangle) = V_\xi(|0\rangle \otimes |01\rangle) = |001\rangle = K_1|\overline{\psi}_0\rangle$$

$$V_\xi(|\psi_0\rangle \otimes |K_2\rangle) = V_\xi(|0\rangle \otimes |10\rangle) = |010\rangle = K_2|\overline{\psi}_0\rangle$$

$$V_\xi(|\psi_0\rangle \otimes |K_3\rangle) = V_\xi(|0\rangle \otimes |11\rangle) = |100\rangle = K_3|\bar{\psi}_0\rangle$$

$$V_\xi(|\psi_1\rangle \otimes |K_3\rangle) = V_\xi(|1\rangle \otimes |01\rangle) = |110\rangle = K_3|\bar{\psi}_1\rangle$$

$$V_\xi(|\psi_1\rangle \otimes |K_2\rangle) = V_\xi(|1\rangle \otimes |10\rangle) = |101\rangle = K_2|\bar{\psi}_1\rangle$$

$$V_\xi(|\psi_1\rangle \otimes |K_1\rangle) = V_\xi(|1\rangle \otimes |11\rangle) = |011\rangle = K_1|\bar{\psi}_1\rangle$$

$$V_\xi(|\psi_1\rangle \otimes |K_0\rangle) = V_\xi(|1\rangle \otimes |00\rangle) = |111\rangle = K_0|\bar{\psi}_1\rangle \quad \text{Equation 8}$$

Since $V_\xi$ is a permutation of computational basis states, it could be efficiently implemented by elementary gates. Thus, for any encoded state $|\bar{\psi}\rangle \in \mathcal{C}$ undergoing a bit-flip noise process $\mathcal{N}$ will admit a tensor product structure $|\psi\rangle \otimes \rho_K$ after the application of the transformation $V_\xi^\dagger$.

Here $\rho_K$ is an ensemble of $\{|K_j\rangle\}$ states that can be simply zeroed to eliminate the error syndromes. Note in this case error correction and decoding are simultaneously accomplished because $\xi$ is a composition of the isomorphism $\sigma$ and the encoding $\epsilon \otimes I_S \otimes I_D$.

In the case of bit-flip code, there are in total four error operators, which can be fully indexed by a two-qubit state. The 3-qubit operation $V_\xi$ that implements the isomorphism $\xi$ is then conveniently a permutation of computational basis states. However, there are cases where $V_\xi$ may not even be unitary. For example, in an exemplary 4-qubit approximate code, single-qubit amplitude damping errors may be correct, as illustrated in Equation 9, where $\gamma$ is a small parameter.

$$K_0 = \begin{pmatrix} 1 & \\ & \sqrt{1-\gamma} \end{pmatrix}, K_1 = \begin{pmatrix} 0 & \sqrt{\gamma} \\ 0 & 0 \end{pmatrix} \quad \text{Equation 9}$$

Let $K_{i_1 i_2 i_3 i_4} = K_{i_1} \otimes K_{i_2} \otimes K_{i_3} \otimes K_{i_4}$, $i_1, i_2, i_3, i_4 \in \{0,1\}$. The set of noise operators is then all 16 possible operators $\{K_s | s \in \{0,1\}^4\}$. However, different $K_s$ operators have different probabilities and only operators with probability $O(\gamma)$ or above are corrected. There are in total five of those operators (among the 16 noise operators), as in Equation 10.

$$\{K_{0000}, K_{0001}, K_{0010}, K_{0100}, K_{1000}\} \quad \text{Equation 10}$$

These five operators can be indexed fully by the states of 3 qubits. For example, the states could be designated as in Equation 11.

$$|K_{0000}\rangle = |00\rangle |1\rangle$$

$$|K_{0001}\rangle = |01\rangle |0\rangle$$

$$|K_{0010}\rangle = |01\rangle |1\rangle$$

$$|K_{0100}\rangle = |10\rangle |0\rangle$$

$$|K_{1000}\rangle = |10\rangle |1\rangle \quad \text{Equation 11}$$

Here the first two qubits in the $|A_s\rangle$ states correspond to the syndrome measurement outcomes. The third qubit is for distinguishing between two different subcases of each syndrome 01 and 10. This provides indexing for all the errors to be corrected. There are extra $2^3 - 5 = 3$ states in the 3-qubit state space that do not correspond to any error occurring. These may be referred to as null syndromes, $s_{null} \in \{000, 110, 111\}$.

The 4-qubit code encodes the logical states $|\psi_0\rangle = |0\rangle$ and $|\psi_1\rangle = |1\rangle$ as in Equation 12.

$$|\bar{\psi}_0\rangle = \frac{1}{\sqrt{2}}(|0000\rangle + |1111\rangle) \quad \text{Equation 12}$$

$$|\bar{\psi}_1\rangle = \frac{1}{\sqrt{2}}(|0011\rangle + |1100\rangle)$$

To realize the isomorphism $\xi$ in the case of the 4-qubit code, an operator $V_\xi$ is required such that for any $i \in \{0,1\}$, Equation 13 holds.

$$V_\xi(|\psi_i\rangle |s_{null}\rangle) = |\bar{\psi}_i\rangle, \forall s_{null} \in \{000, 110, 111\}$$

$$V_\xi(|\psi_i\rangle |K_{0000}\rangle) = K_{0000}|\bar{\psi}_i\rangle$$

$$V_\xi(|\psi_i\rangle |K_{0001}\rangle) = K_{0001}|\bar{\psi}_i\rangle$$

$$V_\xi(|\psi_i\rangle |K_{0100}\rangle) = K_{0010}|\bar{\psi}_i\rangle$$

$$V_\xi(|\psi_i\rangle |K_{0100}\rangle) = K_{0100}|\bar{\psi}_i\rangle$$

$$V_\xi(|\psi_i\rangle |K_{1000}\rangle) = K_{1000}|\bar{\psi}_i\rangle \quad \text{Equation 13}$$

The construction of $V_\xi$ depends on the choice of states $|K_s\rangle$, which is not unique. Thus it will be appreciated that there are alternative choices to Equation 11. Irrespective of how $V_\xi$ is constructed, however, Equation 13 must be followed. Because of the first restriction above which says that $V_\xi$ has to map all three states $|\psi_i\rangle |s_{null}\rangle$ to one state $|\bar{\psi}_i\rangle$, $V_\xi$ is non-unitary regardless of the choice of $|K_s\rangle$ states.

In some embodiments, the constraints in the first line of Equation 13 may be relaxed such that it does not map to $|\bar{\psi}_i\rangle$, but just any state $|i, s_{null}\rangle$. If the error correcting code assumes that the noise is not going to touch this subspace, $V_\xi^\dagger$ may be applied to map $|i, s_{null}\rangle$ back to $|\psi_i\rangle$.

As set out below, an approximate 2-design with $\ell$ applications of the randomization circuit leads to an estimator of the true average fidelity with bias upper bounded by Equation 14.

$$\frac{2^{k(\ell+1)} + 2^{k\ell} - 2}{2^{2k\ell}(2^k - 1)} \sim O(1/2^{k\ell}) \quad \text{Equation 14}$$

Let $v_\ell$ be the measure on the unitary group that is sampled from using an approximate 2-design with $\ell$ repetitions. In the average fidelity estimation scheme, drawing from $v_\ell$ instead of an exact 2-design (such as the Haar measure), means sampling from a biased estimator with mean in Equation 15.

$$\langle E_\ell \rangle = \int \langle 0|U^\dagger W_q^\rightarrow V_p^\rightarrow (U|0\rangle \langle 0|U^\dagger)U|0\rangle dv_\ell(U) \quad \text{Equation 15}$$

An upper bund on the bias is $|\langle F \rangle - \langle E_\ell \rangle|$. The 2-design average over this measure may be renormalized in order to interpret it as a quantum channel $\mathcal{R}_\ell(\sigma) = d \int U^{\otimes 2} \sigma U^{\otimes 2\dagger} dv_\ell(U)$. This quantum channel can be written as a convex combination of two quantum channels as in Equation 16, where $\mathcal{G}$ is the renormalized average of an exact 2-design, $\mathcal{C}_\ell$ is a quantum channel, and $$p_\ell = \frac{d^{\ell+1} + d^\ell - 2}{d^{2\ell}(d-1)},$$

with $d = 2^k$ being the Hilbert space dimension.

$$\mathcal{R}_\ell(\sigma) = (1 - p_\ell)\mathcal{G}(\sigma) + p_\ell \mathcal{C}_\ell(\sigma) \quad \text{Equation 16}$$

To leverage this quantum channel interpretation of the 2-design, the expression in Equation 15 can be rewritten as in Equation 17, where $\mathbb{F}$ is the swap operator on the two systems.

$$\langle \hat{E}_\ell \rangle = \int Tr[W_{\vec{q}} V_{\vec{p}} \otimes \mathcal{T}(U \otimes U|00\rangle\langle 00|U^\dagger \otimes U^\dagger)\mathbb{F}] d\nu_\ell(U) = \quad \text{Equation 17}$$

$$\frac{1}{d} Tr[W_{\vec{q}} V_{\vec{p}} \otimes \mathcal{T}(\mathcal{R}_\ell(|00\rangle\langle 00|))\mathbb{F}]$$

Replacing the channel $\mathcal{R}_\ell$ with the convex combination in Equation 15, an expression is obtained for the estimator mean in terms of the actual mean in Equation 18.

$$\langle \hat{E}_\ell \rangle = \frac{1}{d}(1-p_\ell) Tr[W_{\vec{q}} V_{\vec{p}} \otimes \mathcal{T}(\mathcal{G}(|00\rangle\langle 00|))\mathbb{F}] + \quad \text{Equation 18}$$

$$\frac{1}{d} p_\ell Tr[W_{\vec{q}} V_{\vec{p}} \otimes \mathcal{T}(\mathcal{C}_\ell(|00\rangle\langle 00|))\mathbb{F}] = (1-p_\ell)\langle F \rangle + p_\ell \delta_\ell$$

The bias of the estimator is $|\langle F \rangle - \langle \hat{E}_\ell \rangle| = p_\ell |\langle F \rangle - \delta_\ell|$. To bound this value, Equation 19 is bounded as in Equation 20, where $\alpha$, $\beta \geq 0$ $P_{sym}$ is the projector into the symmetric subspace.

$$\delta_\ell = \frac{1}{d} Tr[W_{\vec{q}} V_{\vec{p}} \otimes \mathcal{T}(\mathcal{C}_\ell(|00\rangle\langle 00|))\mathbb{F}] \quad \text{Equation 19}$$

$$\mathcal{C}_\ell(|00\rangle\langle 00|) = \alpha P_{sym} + \beta \sum_i |ii\rangle\langle ii| \quad \text{Equation 20}$$

Since $\mathcal{C}_\ell$ is separable, it is invariant under partial transpose of either system. The partial transpose of the swap operator is the unnormalized Bell state $\mathbb{F}^{T_B} = \Sigma_{i,j} |ii\rangle\langle jj| \equiv d\Omega$. Since the trace of a bipartite operator is equal to the trace of the partial transpose of that bipartite operator, $$\mathcal{C}_\ell(|00\rangle\langle 00|)^{T_B} = \mathcal{C}_\ell(|00\rangle\langle 00|) \text{ and } \frac{1}{d} \mathbb{F}^{T_B} = \Omega$$

can be used to obtain Equation 21.

$$\delta_\ell = Tr[W_{\vec{q}} V_{\vec{p}} \otimes \mathcal{T}(\mathcal{C}_\ell(|00\rangle\langle 00|))\Omega] \quad \text{Equation 21}$$

Observing that $Tr[W_{\vec{q}} V_{\vec{p}} \otimes \mathcal{T}(\mathcal{C}_\ell(|00\rangle\langle 00|))\Omega]$ is the inner product of two quantum states, this value can be upper bounded by 1. Thus, the bias of the estimator is upper bounded by $$p_\ell = \frac{d^{\ell+1} + d^\ell - 2}{d^{2\ell}(d-1)} \sim O(1/d^\ell).$$

After N samples from this biased estimator, the estimated average fidelity value is expected to deviate from the estimator mean $\langle E_\ell \rangle$ by $\sqrt{\langle E_\ell \rangle(1 - \langle E_\ell \rangle)/N}$. An upper bound on the expected deviation of the sampling-estimated average fidelity from the true average fidelity is given by Equation 22.

$$\frac{1}{\sqrt{N}} + \frac{d^{\ell+1} + d^\ell - 2}{d^{2\ell}(d-1)} \sim O\left(\frac{1}{\sqrt{N}} + \frac{1}{d^\ell}\right) \quad \text{Equation 22}$$

In an exemplary embodiment, the systems and methods described herein are simulated using a Python script supplemented with the Qutip library. The state preparation is performed by generating random instances of approximate 2-design circuits, such as the Nakata circuit. Each instance comprises a plurality of applications of the circuit. The number of repetitions may be chosen to guarantee that the standard deviation or the average fidelity have converged to a predetermined accuracy.

The action of noise channels is simulated using the Kraus operator formalism. In the one qubit case, the action of the channel in the density matrix is give by the operation in Equation 23, where $\rho_i$ is the initial density matrix and $K_j$ are the corresponding Kraus operators satisfying the completeness relation $\Sigma_{j=1}^m K_j^\dagger K_j = I$.

$$\mathcal{N}(\rho) = \sum_{j=1}^m K_j \rho K_j^\dagger \quad \text{Equation 23}$$

To simulate the effect of noise on an N-qubit register, an independent noise model is assumed, where the Kraus operators for N-qubits are written as a tensor product of the Kraus operators for a single qubit. Using $K_{j,l}$ to denote the action of $K_j$ on the lth qubit, the effect of noise on the N-qubit register can be written as in Equation 24, where the sum runs over all the possible $m^N$ tuples of $j_1, \ldots, j_N$ indices.

$$\mathcal{N}^{\otimes N}(\rho) = \sum_{j_1, \cdots, j_N} (K_{j_1,0} \otimes K_{j_N,N}) \rho (K_{j_1,0} \otimes K_{j_N,N})^\dagger \quad \text{Equation 24}$$

The following noise channels are considered in the simulations: amplitude damping (AD), phase damping (PD), bit flip (BF), phase flip and phase damping (BFPD), symmetric depolarizing channel (DEP), amplitude damping plus phase damping (APD) and the Pauli twirling approximation of the APD channel (PTAPD). The Kraus operators for these channels are described in

TABLE 1

| Noise channel | Kraus Operators |
| --- | --- |
| Amplitude damping (AD) | $K_1 = \begin{bmatrix} 1 & 0 \\ 0 & \sqrt{1-p} \end{bmatrix};$ $K_2 = \begin{bmatrix} 0 & \sqrt{p} \\ 0 & 0 \end{bmatrix}$ |
| Phase damping (PD) | $K_1 = \sqrt{p} I;$ $K_2 = \sqrt{1-p} Z$ |
| Bit Flip (BF) | $K_1 = \sqrt{p} I;$ $K_2 = \sqrt{1-p} X$ |
| Phase Flip and phase damping (BFPD) | $K_1 = \sqrt{p} I;$ $K_2 = \sqrt{1-p} Y$ |
| Symmetric depolarizing channel (SDEP) | $K_1 = \sqrt{1 - \frac{3p}{4}} I;$ $K_2 = \sqrt{\frac{p}{4}} X;$ $K_3 = \sqrt{\frac{p}{4}} Y;$ |

TABLE 1-continued

| Noise channel | Kraus Operators |
|---|---|
| | $K_4 = \sqrt{\dfrac{p}{4}} Z$ |
| Asymmetric depolarizing channel (ADEP) | $K_1 = \sqrt{1 - p_x - p_y - p_z}\, I;$ <br> $K_2 = \sqrt{p_x} X;$ <br> $K_3 = \sqrt{p_y} Y;$ <br> $K_4 = \sqrt{p_z} Z$ |

The noise parameters associated to the Kraus operators, $p_1$ and $p_2$, are computed with respect to the experimental parameters corresponding to the time of the computation $(T_c)$, the decay time $(T_1)$, and the dephasing time $(T_2)$, according to the equation $p_i = 1 - \exp(-T_c/T_i)$ with $i = \{1, 2\}$. The case of the PTAPD channel reduces to an asymmetric depolarizing channel with parameters $$p_x = p_y = \frac{p_1}{4} \text{ and } p_z = \frac{p_2}{2} - \frac{p_1}{4}.$$

As encoding and decoding unitaries, programmable quantum circuits are used in various embodiments. This type of circuit generally comprises a fixed networks of gates, where the parameters associated to the gates, i.e., rotation angles, constitute the variables for optimization. The pattern defining the network of gates is regarded as a unit-cell, which can be repeated to increase the flexibility of the model. As noted above, in some embodiments, the programmable circuits are Nakata circuits.

Figure 4:
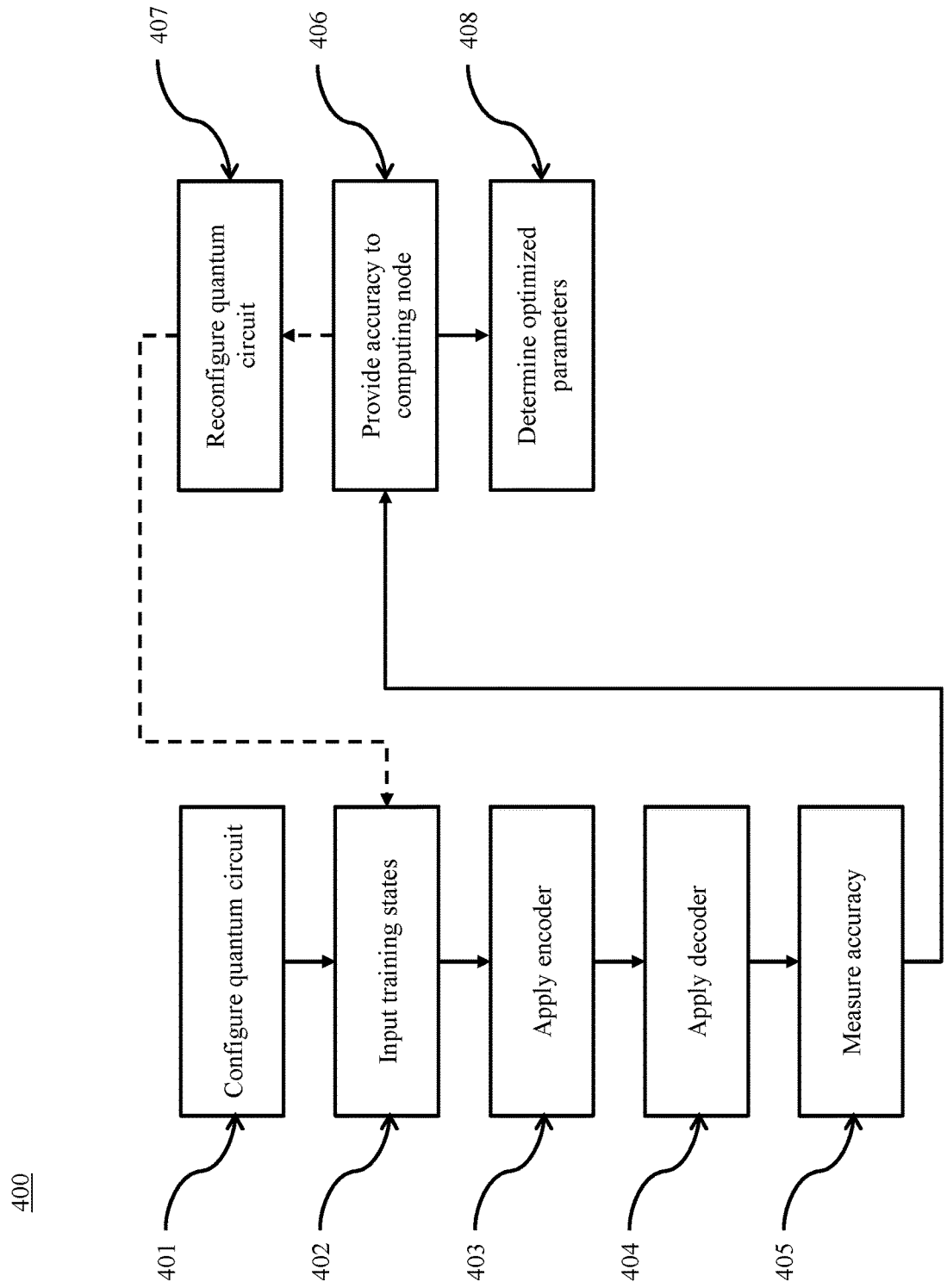
FIG. 4 is a flowchart illustrating a method for error correction according to embodiments of the present disclosure.

Referring now to FIG. 4, a method for error correction in quantum systems is illustrated according to embodiments of the present disclosure. At 401, a quantum circuit is configured according to a plurality of configuration parameters. The quantum circuit comprising a plurality of quantum gates. The plurality of quantum gates corresponds to an encoder and a decoder. In some embodiments, the decoder corresponds to an inverse function of the encoder. At 402, each of a plurality of training states is input to the quantum circuit. At 403, the encoder is applied to each of the plurality of training states and to a plurality of input syndrome qubits having a ground state to produce encoded training states. At 404, the decoder is applied to the encoded training states to determine a plurality of outputs. At 405, an accuracy of the quantum circuit is measured for the plurality of training states based on the plurality of outputs. At 406, the accuracy is provided to a computing node. At 407, the quantum circuit is reconfigured according to a plurality of updated configuration parameters. Accuracy is again measured for the plurality of training states. It will be appreciated that the above steps may be repeated one or more times in order to determine accuracies for a plurality of different configuration parameters. Based on those accuracy measurements, an optimal set of configuration parameters may be determined that maximize the accuracy as determined from the quantum circuit. At 408, the computing node determines a plurality of optimized configuration parameters, the optimized configuration parameters maximizing the accuracy of the quantum circuit for the plurality of training states.

Various physical embodiments of a quantum computer are suitable for use according to the present disclosure. In general, the fundamental data storage unit in quantum computing is the quantum bit, or qubit. The qubit is a quantum-computing analog of a classical digital-computer-system bit. A classical bit is considered to occupy, at any given point in time, one of two possible states corresponding to the binary digits 0 or 1. By contrast, a qubit is implemented in hardware by a physical component with quantum-mechanical characteristics. Each unit has an infinite number of different potential quantum-mechanical states. When the state of a qubit is physically measured, the measurement produces one of two different basis states. Thus, a single qubit can represent a one, a zero, or any quantum superposition of those two qubit states; a pair of qubits can be in any quantum superposition of 4 states; and three qubits in any superposition of 8 states. While qubits are characterized herein as mathematical objects, each corresponds to a physical qubit that can be implemented using a number of different physical implementations, such as trapped ions, optical cavities, individual elementary particles, molecules, or aggregations of molecules that exhibit qubit behavior.

In contrast to classical gates, there are an infinite number of possible single-qubit quantum gates that change the state vector of a qubit. Changing the state of a qubit state vector is therefore referred to as a rotation. A rotation, state change, or single-qubit quantum-gate operation may be represented mathematically by a unitary 2×2 matrix with complex elements.

A quantum circuit can be specified as a sequence of quantum gates. To conceptualize a quantum circuit, the matrices corresponding to the component quantum gates may be multiplied together in the order specified by the symbol sequence to produce a 2×2 complex matrix representing the same overall state change. A quantum circuit may thus be expressed as a single resultant operator. However, designing a quantum circuit in terms of constituent gates allows the design to conform to standard sets of gates, and thus enable greater ease of deployment. A quantum circuit thus corresponds to a design for a physical circuit in a quantum computer.

The quantum gates making up a quantum circuit may have an associated plurality of tuning parameters. For example, in embodiments based on optical switching, tuning parameters may correspond to the angles of individual optical elements.

Various embodiments are described in terms of a unitary 2-design. It will be appreciated that a variety of such implementations are available, including the Nakata circuit. In general, unitary 2-designs are random unitaries simulating up to the second order statistical moments of the uniformly distributed random unitaries, often referred to as Haar random unitaries. Unitary 2-designs can be approximately implemented by alternately repeating random unitaries diagonal in the Pauli-Z basis and in the Pauli-X basis. The Nakata circuits for approximating 2-designs requires $0(N^2)$ gates but can be implemented with linear depth in 1D and 2D architectures. It will be appreciated that Nakata circuits provide for the decrease in error as a function of the number of iterations.

By analogy to classical memory, a quantum memory provides storage and access to quantum information in one or more qubits. However, quantum decoherence provides a significant challenge to long-term storage. Although this may be addressed by isolating the system from its environment, complete isolation is not practical. Moreover, decoherence may arise from the quantum gates, and the lattice vibrations and background thermonuclear spin of the physical system used to implement the qubits. Decoherence is irreversible, as it is effectively non-unitary. Decoherence times (or dephasing times), may range between nanoseconds and seconds at low temperature in different systems. Certain systems require cooling to 20 millikelvins or less in order to prevent significant decoherence. Overall error rates are typically proportional to the ratio of operating time to decoherence time, hence any operation must be completed much more quickly than the decoherence time in the absence of error correction. Accordingly, it will be appreciated that the present disclosure is useful for improving quantum memories by providing ongoing error correction.

It will be appreciated that the quantum methods described herein in terms of real quantum devices may also be used by a classical computer to simulate and find error-correcting codes when the noise model in question is approximately known and the computational overhead is tractable. Because the entire system is simulated in classical memory, sampling the success rate of the output state projected onto the initial reference state is unnecessary. Instead, the exact fidelity can be calculated directly. More generally, a classical computer could in principle (with exponential resources) simulate a quantum algorithm.

Figure 5:
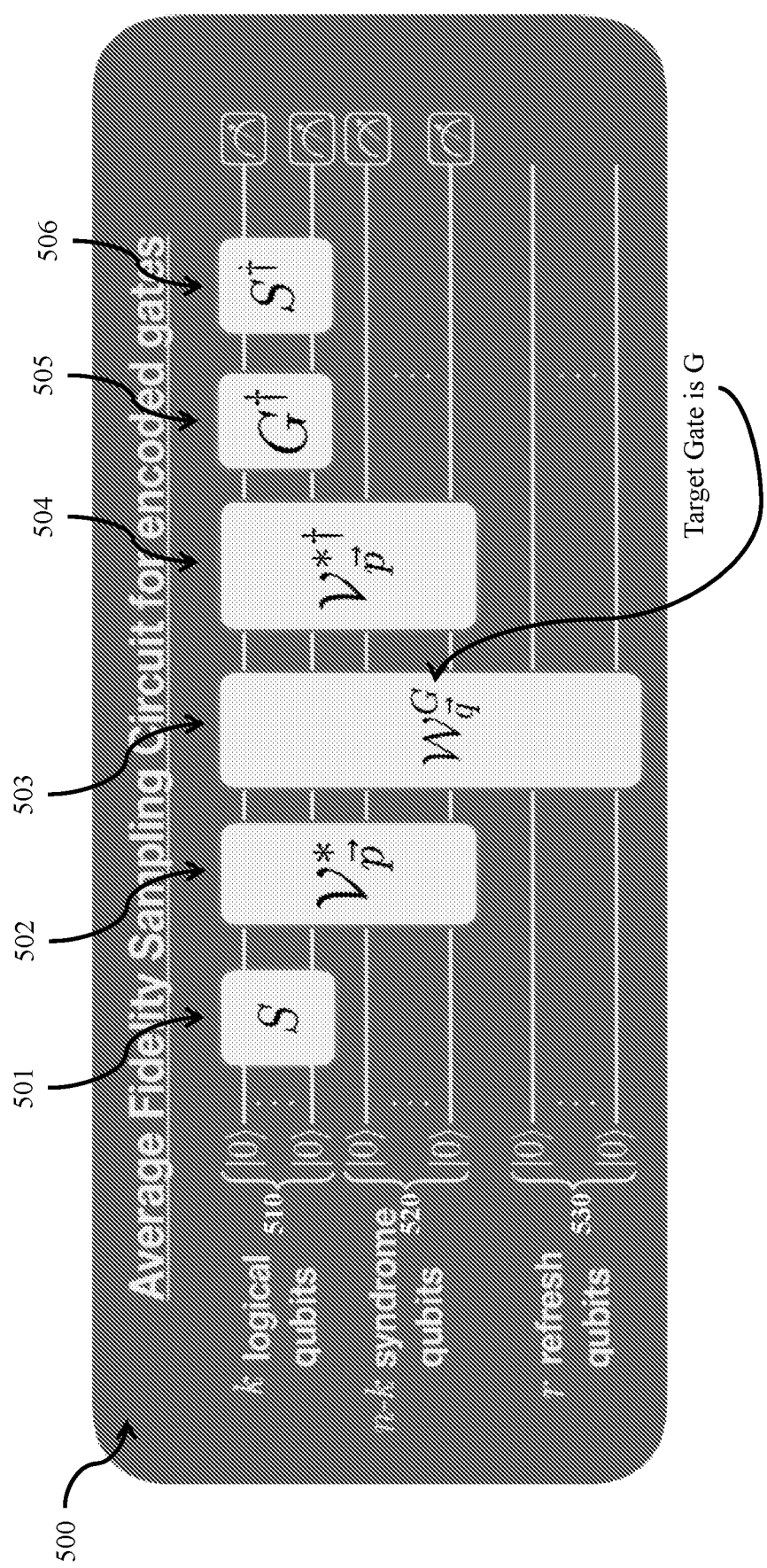
FIG. 5 is a schematic view of a fidelity sampling circuit of a system for error correction according to embodiments of the present disclosure.

Referring now to FIG. 5, a circuit for training an error-corrected gate is illustrated according to embodiments of the present disclosure. As set out above, an error-corrected quantum memory may be formulated as an error-corrected identity gate in a quantum computation. However, as set out below, the present disclosure is applicable to apply error correction more generally to an arbitrary gate G. An average fidelity sampling circuit 500 for encoded gates is shown. Circuit 500 is suitable for use in place of circuit 202 in various embodiments.

Circuit 500, like circuit 202, includes k logical qubits 510, n–k syndrome qubits 520, and r refresh qubits 530. Input logical qubits 510 are transformed by 2-design sampled unitary 501 S. The noisy encoding-recovery circuits 502 . . . 504 $V_{\vec{p}}$, $W_{\vec{q}}$, and $V_{\vec{p}}^\dagger$ are applied. The inverse 506 of S is applied, and the k logical qubits and n–k syndrome bits are measured in the computational basis.

Given a logic gate G for which an error corrected implementation is to be developed, the circuit is first optimized to find the error-corrected identity gate, as set out above, thereby finding optimized $V_{\vec{p}}^*$, $W_{\vec{p}}^*$, and $V_{\vec{p}}^{*\dagger}$. In this initial training step, gate $G^\dagger$ is omitted from the circuit.

After obtaining optimized $V_{\vec{p}}^*$ and $V_{\vec{p}}^{*\dagger}$, gate $G_\dagger$ 505 is introduced to the circuit, where $G^\dagger$ is the physical inverse of the target gate G. Keeping $V_{\vec{p}}^*$ and $V_{\vec{p}}^{*\dagger}$ the same, encoded recovery $W^*_{\vec{q}}$ is retrained to yield $W_{\vec{q}}^G$.

To run an error-corrected quantum computation of logical gate G, the logical input state is prepared. $V_{\vec{p}}^*$, $W_{\vec{q}}^G$ and $V_{\vec{p}}^{*\dagger}$ are applied. The output state is measures on the decoded logical qubits. Likewise, to run an error corrected computation including a series of logical gates $G_1 \ldots G_n$, multiple recovery circuits $W_{\vec{q}}^{G_1} \ldots W_{\vec{q}}^{G_n}$ are trained. To perform the composite computation on the encoded input state, $V_{\vec{p}}^*$, $W_{\vec{q}}^{G_1} \ldots W_{\vec{q}}^{G_n}$, and $V_{\vec{p}}^{*\dagger}$ are applied and the output state is measured on the decoded logical qubits.

If a set of gates $W_{\vec{q}}^{G_1} \ldots W_{\vec{q}}^{G_n}$ is universal for quantum computing, then the above scheme may be used to run fault-tolerant computations. A set of gates in a logical quantum register is universal for quantum computation if it can be used to approximate to arbitrary accuracy any unitary transformation on that register by composing a quantum circuit consisting only of elements of this gate set. These error-corrected gates can be used to implement higher-level layers of error correction, known as concatenation. Furthermore, subroutines such as the quantum Fourier transform on a fixed set of logical qubits or conditional swap gates with a fixed connectivity can be precompiled to be used in quantum algorithms such as phase estimation and quantum fingerprinting.

Figure 6:
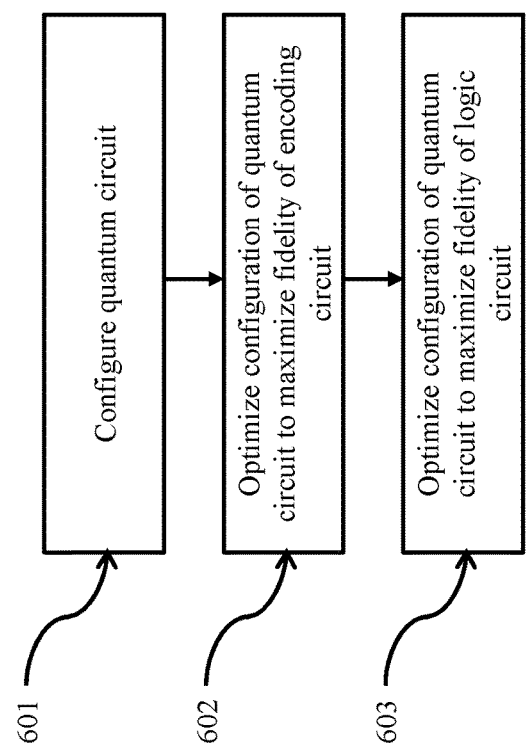
FIG. 6 is a flowchart illustrating a method for error correction according to embodiments of the present disclosure.

Referring now to FIG. 6, a method of training an error-corrected gate is illustrated according to embodiments of the present disclosure. At 601, a quantum circuit comprising an encoding circuit and a decoding circuit is configured. At 602, the configuration of the quantum circuit is optimized to maximize the fidelity of the encoding circuit, for example as set forth above. At 603, the configuration of the quantum circuit is optimized to maximize the fidelity of a logic gate operating on the output of the encoding circuit, for example as set forth above.

Figure 7:
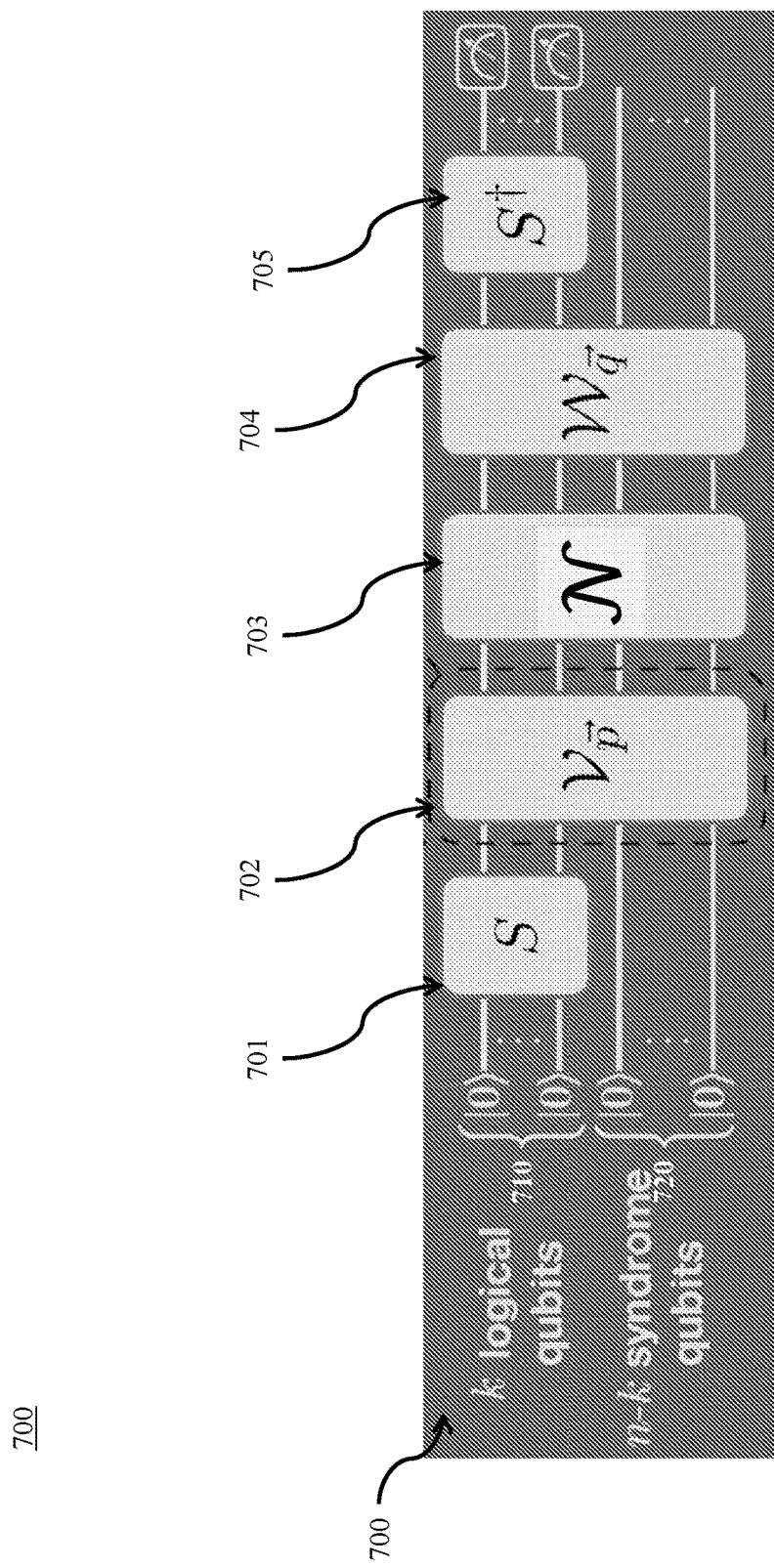
FIG. 7 is a schematic view of a fidelity sampling circuit of a system for error correction according to embodiments of the present disclosure.

Referring to FIG. 7, an exemplary error correction circuit for a quantum sensor is illustrated according to embodiments of the present disclosure. Circuit 700, like circuit 103, includes k logical qubits 710 and n–k syndrome qubits 720. Input logical qubits 710 are transformed by 2-design sampled unitary 701 S. The encoding-recovery circuits 702, 704 $V_{\vec{p}}$ and $W_{\vec{q}}$ are applied. Between these encoding and decoding operations, noise and signal N accumulates. The inverse 705 of S is applied, and the k logical qubits are measured in the computational basis.

In this way, error-correction is provided for use in calibration of a quantum sensor. In particular, the noise is filtered from signal so that the sensitivity of a quantum sensor can be improved. Such a circuit is suitable for use in fields including quantum imaging and quantum metrology.

In this framework, the state preparation represents a control signal (encoded as qubits). The contribution of undesired noise coming from the environment is reduced. In this case, the channel N subjects the system to a change that is the subject of measurement, and additional noise that is unwanted. $V_{\vec{p}}$ and $W_{\vec{q}}$ are trained according to known input-output pairs to calibrate the network to learn an encoding that filters the noise out generally and improves the signal to noise ratio of the sensor.

Figure 8:
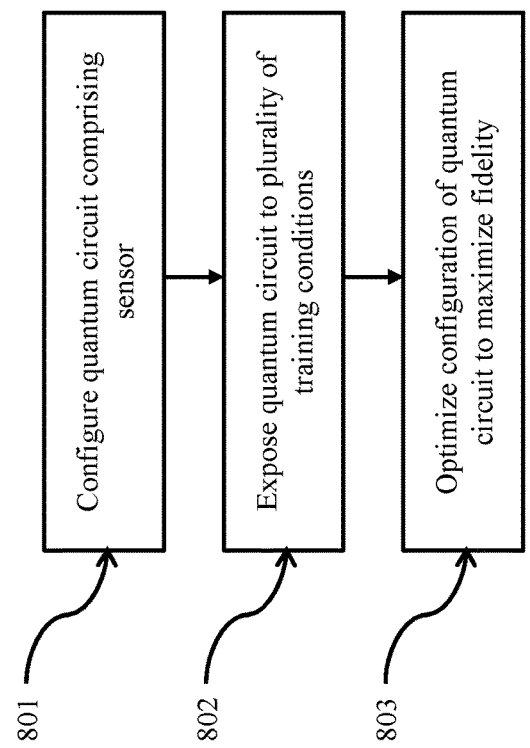
FIG. 8 is a flowchart illustrating a method for error correction according to embodiments of the present disclosure.

Referring to FIG. 8, a method of calibrating a quantum sensor is illustrated according to embodiments of the present disclosure. At 801, a quantum circuit that includes a sensor is configured. At 802, the quantum circuit is exposed to a plurality of training conditions. At 803, the configuration of the quantum circuit is optimized to maximize the fidelity of the circuit.

Figure 9:
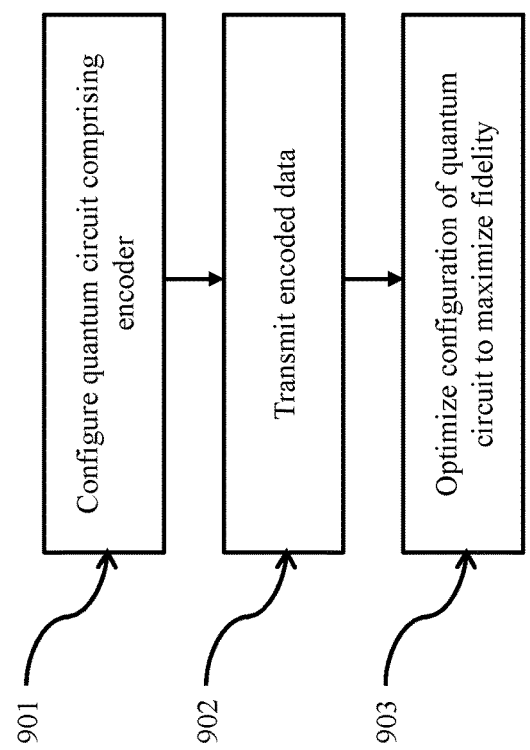
FIG. 9 is a flowchart illustrating a method for error correction according to embodiments of the present disclosure.

Referring to FIG. 9, a method of providing error correction in quantum communications is illustrated according to embodiments of the present disclosure. At 901, a quantum circuit that includes an encoding circuit is configured. At 902, encoded data is transmitted over a communications channel, such as a an optical fiber. At 903, the configuration of the quantum circuit is optimized to maximize the fidelity of the received data.

In this way, a circuit is trained to obtain a resource efficient encoding tailored for the noise process of a given communications channel. The bandwidth of transmission is thereby increased compared with using existing quantum error correcting codes. This approach is applicable in various contexts, including quantum cryptography and satellite communication.

In some instances of a quantum memory, such as during transmission of a quantum state during communication, active error recovery is impractical or unavailable. This situation arises, for instance, if when relaying qubits through an optical fiber or transport qubits between two neighboring quantum processors. As outlined above, an optimized encoding at the source may be followed by a single decoding at the destination. In this case, the noise corresponds to a wait time, the delay between transmission and reception when the state is subject to error.

In addition to the single decoding scenario described above, an encoded recovery step (as described further above in connection with FIGS. 2A-2B) in a quantum repeater network for cases where the wait time is too long and hence too noisy to protect the state from noise for the entire duration.

In some embodiment having refresh qubits, these refresh qubits may be used as check or flag qubits. In such embodiments, the cost function (which may be average fidelity) only counts outcomes when the check qubits indicate no error. This is similar to an error-detection circuit, where results are ignored when a known error has occurred, rather than trying to correct every run. This is useful to provide a guarantee on the result of a quantum operation, at the cost of having to run additional repetitions.

Referring now to FIGS. 10A-B, an exemplary bit-flip encoding circuit is illustrated. In FIG. 10A, just a bit-flip encoding circuit is carried out. In FIG. 10B, a tunable Z-gate is inserted in the middle of the circuit, with a rotation angle θ. This circuit was simulated using Rigetti's Quantum Virtual Machine and implemented using Rigetti's Quantum Processing Unit. The success of the encoding was determined as the fraction of correctly-flagged runs (000, 101, 011, 110), as a function of the Z-gate rotation angle θ.

Figure 11:
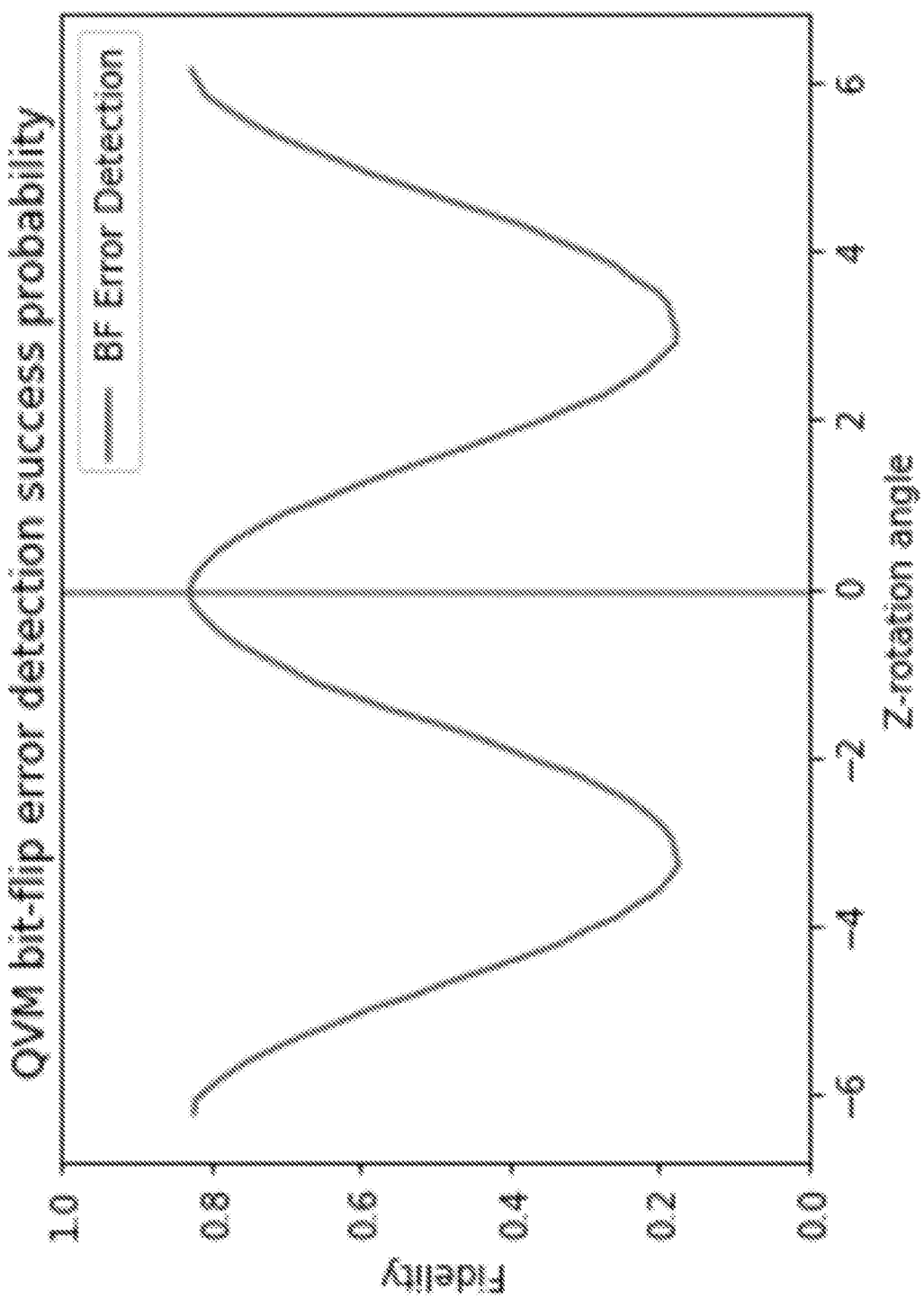
FIG. 11 is a graph of fidelity relative to Z-rotation angle of an exemplary bit-flip encoding circuit under simulation according to embodiments of the present disclosure.
Figure 12:
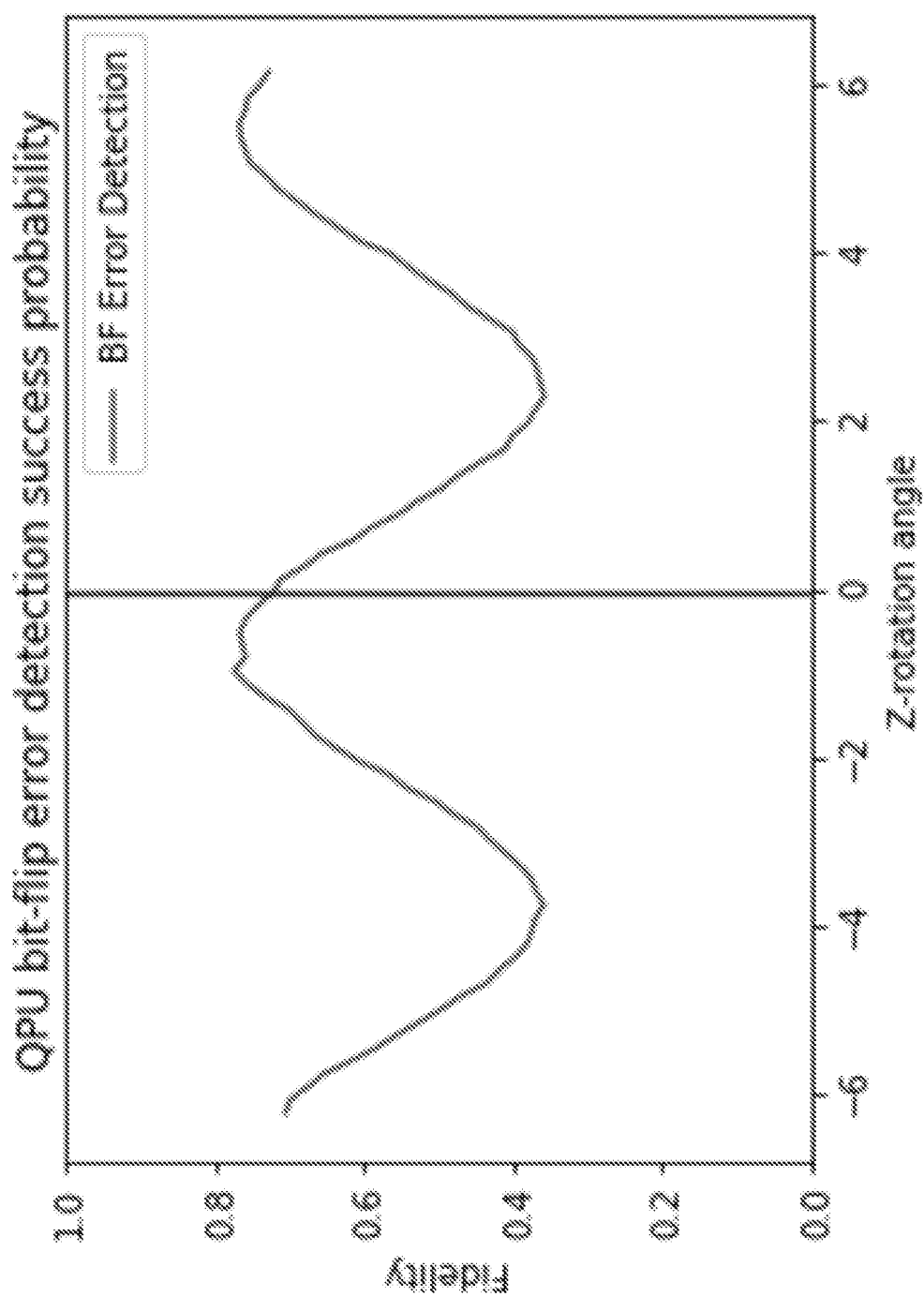
FIG. 12 is a graph of fidelity relative to Z-rotation angle of an exemplary bit-flip encoding circuit under testing according to embodiments of the present disclosure.
Figure 13:
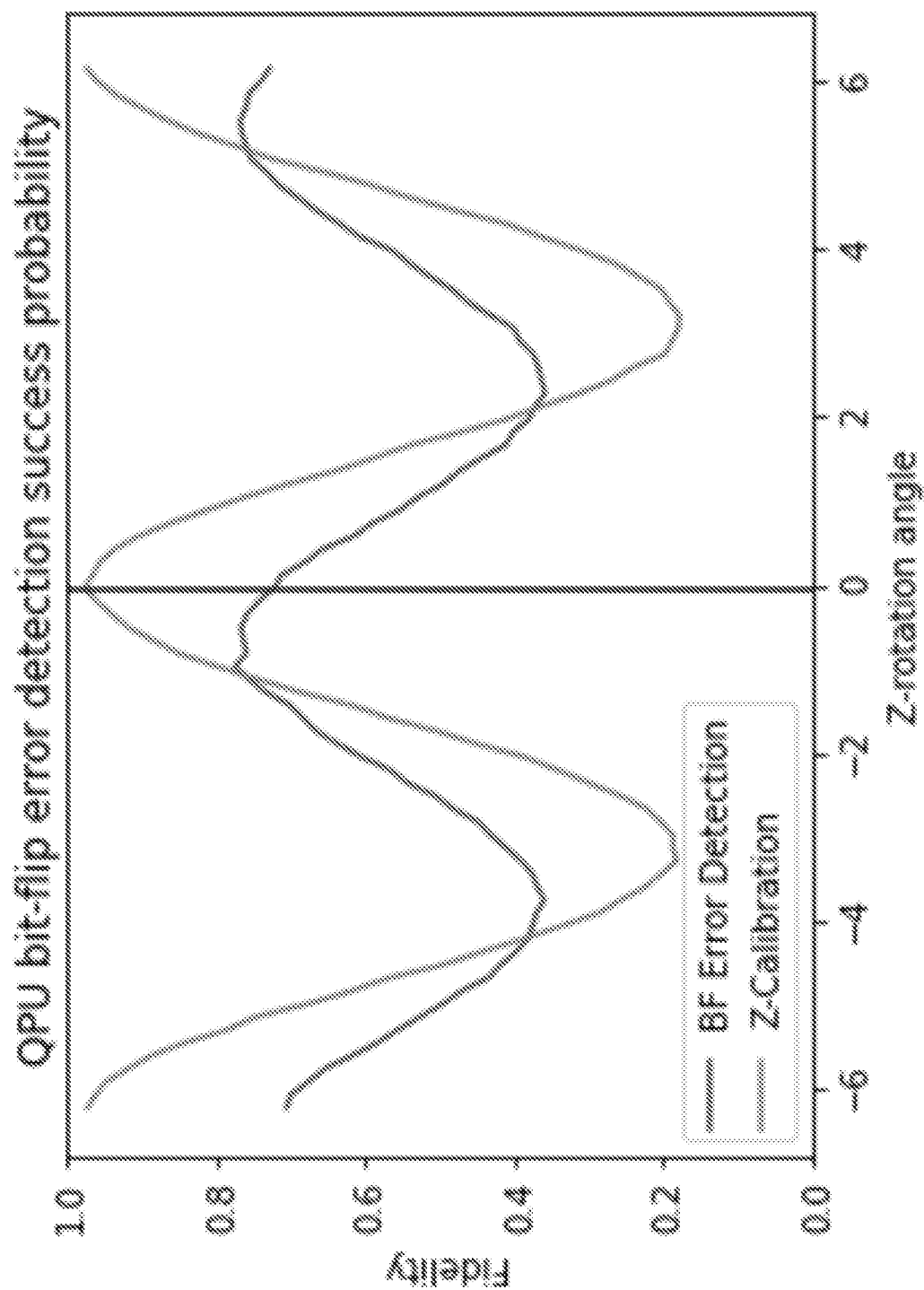
FIG. 13 is a graph of fidelity relative to Z-rotation angle of an exemplary bit-flip encoding circuit under testing compared to Z-calibration according to embodiments of the present disclosure.

As shown in FIGS. 11-13, there is a discrepancy between simulations and implementation for design of error correcting circuits. In particular, FIG. 11 shows that, using the simulator, the optimal choice of angle appears to be θ=0. As shown in FIG. 12, using the actual quantum processor, however, shows that the true optimal choice of angle is θ=−1 rad. Referring to FIG. 13, this shift is shown not to be simply due to a calibration error in the inserted Z-gate, as the probability of 0 after the circuit $X_{\pi/2} Z(\theta) X_{-\pi/2}$ is found to be centered at θ=0.

Figure 14:
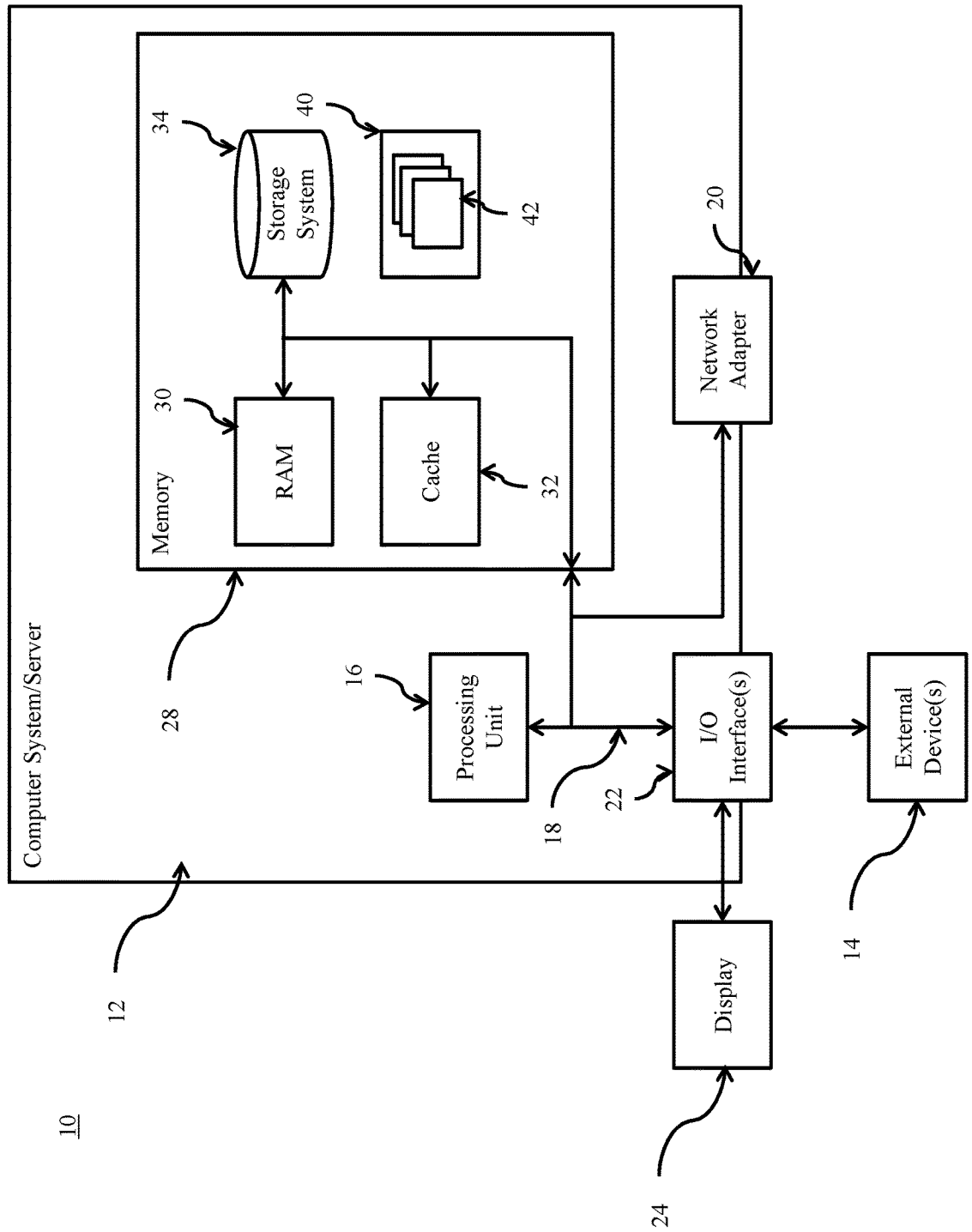
FIG. 14 depicts a classical computing node according to embodiments of the present disclosure.

Referring now to FIG. 14, a schematic of an example of a classical computing node is shown. Computing node 10 is only one example of a suitable computing node and is not intended to suggest any limitation as to the scope of use or functionality of embodiments of the invention described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 14, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for error correction in a quantum circuit, the method comprising:
    configuring a quantum circuit according to a plurality of configuration parameters, the quantum circuit comprising an encoding circuit and a decoding circuit;
    inputting each of a plurality of training states to the quantum circuit, each training state comprising a plurality of logical qubits;
    applying the encoding circuit to each of the plurality of training states and to a plurality of input syndrome qubits, each syndrome qubit having a default state, to produce encoded training states;
    applying the decoding circuit to each of the encoded training states to determine a plurality of outputs;
    measuring a fidelity of the quantum circuit for the plurality of training states based on the plurality of outputs;
    providing the fidelity to a computing node;
    determining a first plurality of optimized configuration parameters by the computing node, the first plurality of optimized configuration parameters maximizing the fidelity of the encoding circuit for the plurality of training states.

2. The method of claim 1, wherein the quantum circuit further comprises a recovery circuit, the method further comprising:
    applying the recovery circuit to each of the encoded training states and to a plurality of refresh qubits, each refresh qubit having a default state;
    measuring a fidelity of the recovery circuit;
    providing the fidelity of the recovery circuit to the computing node;
    determining a second plurality of optimized configuration parameters by the computing node, the second plurality of optimized configuration parameters maximizing the fidelity of the recovery circuit.

3. The method of claim 1, wherein the default state is a ground state.

4. The method of claim 1, wherein determining the plurality of optimized configuration parameters further comprises:
    iteratively reconfiguring the quantum circuit according to a plurality of updated configuration parameters and measuring the fidelity of the quantum circuit for the plurality of training states.

5. The method of claim 1, further comprising:
    randomly selecting the plurality of training states from a superset of training states.

6. The method of claim 1, wherein measuring the fidelity comprises:
    determining an average fidelity estimate of the quantum circuit; determining a worst-case fidelity of the quantum circuit; or measuring an error rate of the quantum circuit.

7. The method of claim 1, wherein the quantum circuit comprises:
    nonlinear optical media; a cavity quantum electrodynamics device; an ion trap; a nuclear magnetic resonance device; a superconducting device; or a solid state device.

8. A system comprising:
    a quantum circuit, comprising an encoding circuit and a decoding circuit, the quantum circuit configured to:
        apply the encoding circuit to each of a plurality of training states and to a plurality of input syndrome qubits, each training state comprising a plurality of logical qubits, and each syndrome qubit having a default state, to produce encoded training states;
        apply the decoding circuit to the encoded training states to determine a plurality of outputs;
        measure a fidelity of the quantum circuit for the plurality of training states based on the plurality of outputs;
        providing the fidelity to a computing node, and
    a computing node comprising a computer readable storage medium having program instructions embodied therewith, the program instructions executable by a processor of the computing node to cause the processor to perform a method comprising:
        configuring the quantum circuit according to a plurality of configuration parameters;
        inputting each of a plurality of training states to the quantum circuit;
        receiving the fidelity from the quantum circuit;
        determining a first plurality of optimized configuration parameters, the optimized configuration parameters maximizing the accuracy of the encoding circuit for the plurality of training states.

9. The system of claim 8, wherein the quantum circuit further comprises a recovery circuit, the quantum circuit further configured to:
    apply the recovery circuit to each of the encoded training states and to a plurality of refresh qubits, each refresh qubit having a default state;
    measure a fidelity of the recovery circuit;
    provide the fidelity of the recovery circuit to the computing node, and wherein the method further comprises:
    determining a second plurality of optimized configuration parameters, the second plurality of optimized configuration parameters maximizing the fidelity of the recovery circuit.

10. The system of claim 8, wherein the default state is a ground state.

11. The system of claim 8, wherein determining the plurality of optimized configuration parameters further comprises:
    iteratively reconfiguring the quantum circuit according to a plurality of updated configuration parameters and measuring the fidelity of the quantum circuit for the plurality of training states.

12. The system of claim 8, wherein the method further comprises:
    randomly selecting the plurality of training states from a superset of training states.

13. The system of claim 8, wherein measuring the fidelity comprises:
determining an average fidelity estimate of the quantum circuit; determining a worst-case fidelity of the quantum circuit; or measuring an error rate of the quantum circuit.

14. The system of claim 8, wherein the quantum circuit comprises:
nonlinear optical media; a cavity quantum electrodynamics device; an ion trap; a nuclear magnetic resonance device; a superconducting device; or a solid state device.

15. A computer program product for error correction in a quantum circuit, the computer program product comprising a computer readable storage medium having program instructions embodied therewith, the program instructions executable by a processor to cause the processor to perform a method comprising:
configuring a quantum circuit according to a plurality of configuration parameters, the quantum circuit comprising an encoding circuit and a decoding circuit;
inputting each of a plurality of training states to the quantum circuit, each training state comprising a plurality of logical qubits;
receiving a fidelity of the quantum circuit for the plurality of training states from the quantum circuit, the fidelity being determined by the quantum circuit by applying the encoding circuit to each of the plurality of training states and to a plurality of input syndrome qubits, each syndrome qubit having a ground state, to produce encoded training states and applying the decoding circuit to the encoded training states to determine a plurality of outputs;
determining a first plurality of optimized configuration parameters, the first plurality of optimized configuration parameters maximizing the accuracy of the quantum circuit for the plurality of training states.

16. The computer program product of claim 15, wherein the quantum circuit further comprises a recovery circuit, the method further comprising:
receiving a fidelity of the recovery circuit, the fidelity of the recovery circuit being determined by applying the recovery circuit to each of the encoded training states and to a plurality of refresh qubits, each refresh qubit having a default state;
determining a second plurality of optimized configuration parameters, the second plurality of optimized configuration parameters maximizing the fidelity of the recovery circuit.

17. The computer program product of claim 16, wherein the default state is a ground state.

18. The computer program product of claim 15, wherein determining the plurality of optimized configuration parameters further comprises:
iteratively reconfiguring the quantum circuit according to a plurality of updated configuration parameters and measuring fidelity of the quantum circuit for the plurality of training states.

19. The computer program product of claim 15, wherein the method further comprises:
randomly select the plurality of training states from a superset of training states.

20. The computer program product of claim 15, wherein measuring the fidelity comprises: determining an average fidelity estimate of the quantum circuit;
determining a worst-case fidelity of the quantum circuit; or measuring an error rate of the quantum circuit.

21. The computer program product of claim 15, wherein the quantum circuit comprises: a cavity quantum electrodynamics device; a cavity quantum electrodynamics device; an ion trap; a nuclear magnetic resonance device; a superconducting device; or a solid state device.

22. A method for configuring a quantum memory, the method comprising:
selecting a quantum circuit from a plurality of quantum circuits, the plurality of quantum circuits being arranged in series;
configuring the quantum circuit according to a plurality of configuration parameters, the quantum circuit comprising an encoding circuit and a decoding circuit;
inputting each of a plurality of training states to the quantum circuit, each training state comprising a plurality of logical qubits;
applying the encoding circuit to each of the plurality of training states and to a plurality of input syndrome qubits, each syndrome qubit having a default state, to produce encoded training states;
applying the decoding circuit to the encoded training states to determine a plurality of outputs;
measuring a fidelity of the quantum circuit for the plurality of training states based on the plurality of outputs;
providing the fidelity to a computing node;
determining a first plurality of optimized configuration parameters by the computing node, the first plurality of optimized configuration parameters maximizing the accuracy of the quantum circuit for the plurality of training states.

23. The method of claim 22, wherein the quantum circuit further comprises a recovery circuit, the method further comprising:
applying the recovery circuit to each of the encoded training states and to a plurality of refresh qubits, each refresh qubit having a default state;
measuring a fidelity of the recovery circuit;
providing the fidelity of the recovery circuit to the computing node;
determining a second plurality of optimized configuration parameters by the computing node, the second plurality of optimized configuration parameters maximizing the fidelity of the recovery circuit.

24. The method of claim 22, wherein the default state is a ground state.

25. The method of claim 22, wherein determining the plurality of optimized configuration parameters further comprises:
iteratively reconfiguring the quantum circuit according to a plurality of updated configuration parameters and measuring accuracy of the quantum circuit for the plurality of training states.

26. The method of claim 22, further comprising:
randomly selecting the plurality of training states from a superset of training states.

27. The method of claim 22, wherein measuring the fidelity comprises: determining an average fidelity estimate of the quantum circuit; determining a worst-case fidelity of the quantum circuit; or measuring an error rate of the quantum circuit.

28. The method of claim 22, wherein the quantum circuit comprises:
nonlinear optical media; a cavity quantum electrodynamics device; an ion trap; a nuclear magnetic resonance device; a superconducting device; or a solid state device.

29. A quantum memory comprising:
a plurality of quantum circuits arranged in series, each quantum circuit comprising an encoding circuit and a decoding circuit, each quantum circuit being configured to:
apply the encoding circuit to each of a plurality of training states and to a plurality of input syndrome qubits, each training state comprising a plurality of logical qubits, and each syndrome qubit having a default state, to produce encoded training states;
apply the decoding circuit to the encoded training states to determine a plurality of outputs;
measure a fidelity of the quantum circuit for the plurality of training states based on the plurality of outputs;
providing the fidelity to a computing node;
a computing node comprising a computer readable storage medium having program instructions embodied therewith, the program instructions executable by a processor of the computing node to cause the processor to perform a method comprising:
configuring each quantum circuit according to a plurality of configuration parameters;
inputting each of a plurality of training states to each quantum circuit;
receive the fidelity from each quantum circuit;
determine a first plurality of optimized configuration parameters, the first plurality of optimized configuration parameters maximizing the fidelity of each quantum circuit for the plurality of training states.

30. The quantum memory of claim 29, wherein the quantum circuit further comprises a recovery circuit, the quantum circuit further configured to:
apply the recovery circuit to each of the encoded training states and to a plurality of refresh qubits, each refresh qubit having a default state;
measure a fidelity of the recovery circuit;
provide the fidelity of the recovery circuit to the computing node, and wherein the method further comprises:
determining a second plurality of optimized configuration parameters, the second plurality of optimized configuration parameters maximizing the fidelity of the recovery circuit.

31. The quantum memory of claim 29, wherein the default state is a ground state.

32. The quantum memory of claim 29, wherein determining the plurality of optimized configuration parameters further comprises:
iteratively reconfiguring the quantum circuit according to a plurality of updated configuration parameters and measuring accuracy of the quantum circuit for the plurality of training states.

33. The quantum memory of claim 29, wherein the method further comprising:
randomly selecting the plurality of training states from a superset of training states.

34. The quantum memory of claim 29, wherein measuring the fidelity comprises: determining an average fidelity estimate of the quantum circuit; determining a worst-case fidelity of the quantum circuit; or measuring an error rate of the quantum circuit.

35. The quantum memory of claim 29, wherein the quantum circuit comprises: nonlinear optical media; a cavity quantum electrodynamics device; an ion trap; a nuclear magnetic resonance device; a superconducting device; or a solid state device.

36. A method for error correction in a quantum circuit, the method comprising:
configuring a quantum circuit according to a plurality of configuration parameters, the quantum circuit comprising an encoding circuit and a decoding circuit;
providing each of a plurality of training states to the quantum circuit, each training state represented by a plurality of logical qubits;
applying the encoding circuit to the logical qubits representing each of the plurality of training states and to a plurality of input syndrome qubits having a default state, to produce encoded training states;
applying a logic circuit to the encoded training states and to a plurality of refresh qubits having a default state to determine a plurality of encoded outputs;
applying the decoding circuit to each of the plurality of encoded outputs to determine a plurality of unencoded outputs;
applying an inverse of the logic circuit to the plurality of unencoded outputs to determine a plurality of circuit outputs;
measuring a fidelity of the quantum circuit for the plurality of training states based on the plurality of circuit outputs;
providing the fidelity to a computing node;
determining a plurality of optimized configuration parameters by the computing node, the plurality of optimized configuration parameters maximizing the fidelity of the logic circuit for the plurality of training states.

37. The method of claim 36, further comprising:
determining the plurality of configuration parameters according to the method of claim 1.

38. The method of claim 36, wherein determining the plurality of optimized configuration parameters further comprises:
iteratively reconfiguring the quantum circuit according to a plurality of updated configuration parameters and measuring the fidelity of the quantum circuit for the plurality of training states.

39. The method of claim 36, further comprising:
randomly selecting the plurality of training states from a superset of training states.

40. The method of claim 36, wherein measuring the fidelity comprises: determining an average fidelity estimate of the quantum circuit; determining a worst-case fidelity of the quantum circuit; or measuring an error rate of the quantum circuit.

41. The method of claim 36, wherein the quantum circuit comprises:
nonlinear optical media; a cavity quantum electrodynamics device; an ion trap; a nuclear magnetic resonance device; a superconducting device; or a solid state device.

42. A method for error correction in a quantum circuit, the method comprising:
configuring a quantum circuit according to a plurality of configuration parameters, the quantum circuit comprising an encoding circuit, a sensing circuit, and a decoding circuit;
providing a control signal to the quantum circuit, the control signal represented by a plurality of qubits;
applying the encoding circuit to the qubits representing the control signal and to a plurality of input syndrome qubits having a default state, to produce an encoded control state;

exposing the sensing circuit to a plurality of training conditions to determine a plurality of noisy sensor signals;

applying the decoding circuit to the plurality of noisy sensor signals to determine a plurality of outputs;

measuring a fidelity of the quantum circuit for the plurality of training conditions based on the plurality of outputs;

providing the fidelity to a computing node;

determining a plurality of optimized configuration parameters by the computing node, the plurality of optimized configuration parameters maximizing the fidelity of the quantum circuit for the plurality of training conditions.

43. The method of claim 42, wherein determining the plurality of optimized configuration parameters further comprises:

iteratively reconfiguring the quantum circuit according to a plurality of updated configuration parameters and measuring the fidelity of the quantum circuit for the plurality of training conditions.

44. The method of claim 42, wherein measuring the fidelity comprises: determining an average fidelity estimate of the quantum circuit; determining a worst-case fidelity of the quantum circuit; or measuring an error rate of the quantum circuit.

45. The method of claim 42, wherein the quantum circuit comprises:

nonlinear optical media; a cavity quantum electrodynamics device; an ion trap; a nuclear magnetic resonance device; a superconducting device; or a solid state device.

46. A method for error correction in quantum communication, the method comprising:

configuring a quantum circuit according to a plurality of configuration parameters, the quantum circuit comprising an encoding circuit;

providing each of a plurality of training states to the quantum circuit, each training state represented by a plurality of logical qubits;

applying the encoding circuit to the logical qubits representing each of the plurality of training states and to a plurality of input syndrome qubits having a default state, to produce encoded training states;

transmitting the encoded training states via a communications channel to a receiver;

measuring a fidelity of the quantum circuit for the plurality of training states based on the encoded training states as received by the receiver;

providing the fidelity to a computing node;

determining a plurality of optimized configuration parameters by the computing node, the plurality of optimized configuration parameters maximizing the fidelity of the encoding circuit for the plurality of training states and the communications channel.

47. The method of claim 46, wherein determining the plurality of optimized configuration parameters further comprises:

iteratively reconfiguring the quantum circuit according to a plurality of updated configuration parameters and measuring the fidelity of the quantum circuit for the plurality of training states.

48. The method of claim 46, wherein measuring the fidelity comprises: determining an average fidelity estimate of the quantum circuit; determining a worst-case fidelity of the quantum circuit; or measuring an error rate of the quantum circuit.

49. The method of claim 46, wherein the quantum circuit comprises:

nonlinear optical media; a cavity quantum electrodynamics device; an ion trap; a nuclear magnetic resonance device; a superconducting device; or a solid state device.

* * * * *